(12) United States Patent
Jung et al.

(10) Patent No.: US 11,824,033 B2
(45) Date of Patent: Nov. 21, 2023

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Gyoyoung Jung, Suwon-si (KR); Jinsu Kim, Seoul (KR); Hyunsuk Yang, Asan-si (KR); Kiju Lee, Seoul (KR); Hoyeon Jo, Osan-si (KR); Ikkyu Jin, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/149,342

(22) Filed: Jan. 3, 2023

(65) Prior Publication Data

US 2023/0133567 A1 May 4, 2023

Related U.S. Application Data

(63) Continuation of application No. 17/342,902, filed on Jun. 9, 2021, now Pat. No. 11,552,038.

(30) Foreign Application Priority Data

Oct. 27, 2020 (KR) .................. 10-2020-0140455

(51) Int. Cl.
*H01L 23/00* (2006.01)
*H01L 25/16* (2023.01)

(52) U.S. Cl.
CPC .............. *H01L 24/20* (2013.01); *H01L 24/13* (2013.01); *H01L 24/19* (2013.01); *H01L 24/24* (2013.01);

(Continued)

(58) Field of Classification Search
CPC ........ H01L 24/13; H01L 24/19; H01L 24/20; H01L 24/24; H01L 24/25; H01L 24/73; H01L 25/16; H01L 2224/13024
See application file for complete search history.

(56) References Cited

U.S. PATENT DOCUMENTS 5,459,642 A 10/1995 Stoddard
6,037,044 A 3/2000 Giri et al.
(Continued)

FOREIGN PATENT DOCUMENTS

JP 2008-0192808 A 8/2008

*Primary Examiner* — Brook Kebede
(74) *Attorney, Agent, or Firm* — Harness, Dickey & Pierce, P.L.C.

(57) ABSTRACT

A semiconductor package including a core substrate, a semiconductor chip in the core substrate and having chip pads, a redistribution wiring layer covering a lower surface of the core substrate and including redistribution wirings electrically connected to the chip pads and a pair of capacitor pads exposed from an outer surface of the redistribution wiring layer, conductive pastes on the capacitor pads, respectively, and a capacitor via the conductive pastes and having first and second outer electrodes on the capacitor pads, respectively, may be provided. Each of the capacitor pads includes a pad pattern exposed from the outer surface of the redistribution wiring layer, and at least one via pattern at a lower portion of the pad pattern and electrically connected to at least one of the redistribution wirings. The via pattern is eccentric by a distance from a center line of the pad pattern.

20 Claims, 29 Drawing Sheets

(52) U.S. Cl.
CPC .............. *H01L 24/25* (2013.01); *H01L 24/73* (2013.01); *H01L 25/16* (2013.01); *H01L 2224/13005* (2013.01); *H01L 2224/13024* (2013.01); *H01L 2224/2105* (2013.01); *H01L 2224/2201* (2013.01); *H01L 2224/2205* (2013.01); *H01L 2224/24155* (2013.01); *H01L 2224/24265* (2013.01); *H01L 2224/2518* (2013.01); *H01L 2224/25171* (2013.01); *H01L 2224/73217* (2013.01); *H01L 2924/1431* (2013.01); *H01L 2924/1436* (2013.01); *H01L 2924/1437* (2013.01); *H01L 2924/1441* (2013.01); *H01L 2924/1443* (2013.01); *H01L 2924/19041* (2013.01); *H01L 2924/19104* (2013.01)

(56) References Cited

U.S. PATENT DOCUMENTS

| | | |
|---|---|---|
| 6,833,615 B2 | 12/2004 | Geng et al. |
| 7,164,085 B2 | 1/2007 | Saiki |
| 8,232,479 B2 | 7/2012 | Satou |
| 10,304,768 B2 | 5/2019 | Nakagawa et al. |
| 2003/0122244 A1* | 7/2003 | Lin .................... H01L 23/3114 257/E23.101 |
| 2005/0282315 A1 | 12/2005 | Jeong et al. |
| 2011/0316119 A1 | 12/2011 | Kim et al. |
| 2017/0338207 A1* | 11/2017 | Chen .................... H01L 21/565 |
| 2019/0057949 A1 | 2/2019 | Hwang et al. |
| 2020/0144173 A1 | 5/2020 | Kim et al. |

* cited by examiner

SEMICONDUCTOR PACKAGE AND METHOD OF MANUFACTURING THE SEMICONDUCTOR PACKAGE

PRIORITY STATEMENT

This application is a continuation of U.S. application Ser. No. 17/342,902, filed on Jun. 9, 2021, which claims priority under 35 U.S.C. § 119 to Korean Patent Application No. 10-2020-0140455, filed on Oct. 27, 2020 in the Korean Intellectual Property Office (KIPO), the contents of each of which are herein incorporated by reference in their entirety.

BACKGROUND

1. Field

Example embodiments relate to semiconductor packages and/or methods of manufacturing the semiconductor package. More particularly, example embodiments relate to semiconductor packages having a passive device and/or methods of manufacturing the same.

2. Description of the Related Art

A fan out package having a relatively thin thickness may include a thin film capacitor capable of implementing a thinner thickness as a passive device. The thin film capacitor may be a decoupling capacitor for an application processor and may be manufactured in the form of a Land-Side Capacitor (LSC). The LSC type capacitor may be mounted via a solder paste. However, during a reflow process for mounting the capacitor, a flux gas vaporized from the solder paste may be collected to form a relatively large void in the joint, thereby deteriorating junction reliability.

SUMMARY

Some example embodiments provide semiconductor packages capable of improving junction reliability with a capacitor.

Some example embodiments provide methods of manufacturing the semiconductor package.

According to some example embodiments, a semiconductor package may include a core substrate, at least one semiconductor chip in the core substrate and having chip pads, a redistribution wiring layer covering a lower surface of the core substrate and including redistribution wirings electrically connected to the chip pads and a pair of capacitor pads, the chip pads and a pair of capacitor pads exposed from an outer surface of the redistribution wiring layer and electrically connected to corresponding ones of the redistribution wirings, respectively, conductive pastes on the capacitor pads, respectively, and a capacitor on a pair of the capacitor pads via the conductive pastes, the capacitor having first and second outer electrodes, the first and second outer electrodes on the capacitor pads, respectively. Each of the capacitor pads may include a pad pattern exposed from the outer surface of the redistribution wiring layer and at least one via pattern at a lower portion of the pad pattern, the at least one via pattern electrically connected to at least one of the redistribution wirings. The via pattern may be eccentric by a distance from a center line of the pad pattern.

According to some example embodiments, a semiconductor package may include a redistribution wiring layer having a first surface and a second surface opposite to each other, the redistribution wiring layer including redistribution wirings stacked in at least two levels a pair of capacitor pads exposed from the second surface and electrically connected to a corresponding pair of the redistribution wirings, respectively, at least one semiconductor chip on the first surface of the redistribution wiring layer, the at least one semiconductor chip having chip pads electrically connected to corresponding ones of the redistribution wirings, respectively, a mold substrate on the redistribution wiring layer and covering the semiconductor chip, conductive pastes on the capacitor pads, respectively, and a capacitor on a pair of the capacitor pads via the conductive pastes, the capacitor having first and second outer electrodes, the first and second outer electrodes on the capacitor pads, respectively. Each of the capacitor pads may include a pad pattern exposed from the second surface of the redistribution wiring layer and at least one via pattern at a lower portion of the pad pattern, the at least one via pattern electrically connected to at least one of the redistribution wirings. The via pattern may be eccentric by a distance from a center line of the pad pattern. A diameter of the via pattern may be 40% or less of a width of the pad pattern.

According to some example embodiments, a semiconductor package may include a core substrate, at least one semiconductor chip in the core substrate and having chip pads, a redistribution wiring layer covering a lower surface of the core substrate and including redistribution wirings electrically connected to the chip pads, a solder ball pad exposed from an outer surface of the redistribution wiring layer, a pair of capacitor pads exposed from the outer surface of the redistribution wiring layer and electrically connected to corresponding ones of the redistribution wirings, respectively, and a capacitor on a pair of the capacitor pads with conductive pastes interposed therebetween, the capacitor having first and second outer electrodes, the first and second outer electrodes on the capacitor pads, respectively. Each of the capacitor pads may include a pad pattern exposed from the outer surface of the redistribution wiring layer and at least one via pattern extending downwardly from the pad pattern and electrically connected to the redistribution wiring layer. The pad pattern may be a rectangular pad having a relatively long side and a relatively short side, and the via pattern is eccentric by a distance from a center line that passes a midpoint of the relatively short side of the pad pattern. A diameter of the solder ball pad may be greater than a width of each of the capacitor pads.

According to some example embodiments, a semiconductor package as a fan-out package may include a core substrate provided as a frame in a region outside a semiconductor chip, a redistribution wiring layer covering a lower surface of the core substrate and at least one capacitor on an outer surface of the redistribution wiring layer. The redistribution wiring layer may include a pair of capacitor pads exposed from the outer surface thereof, and first and second outer electrodes of the capacitor may be on a pair of the capacitor pads with conductive pastes interposed therebetween.

Each of the capacitor pads may include a pad pattern and at least one via pattern. The via pattern may be eccentric by a desired (or alternatively, predetermined) distance from a center line of the pad pattern. A diameter of the via pattern may be 40% or less of a width of the pad pattern.

Accordingly, because the via pattern is located eccentric from the center of the pad pattern and the via pattern has a relatively small diameter, a flux gas generated from the conductive paste such as a solder paste may move to an edge region of the pad pattern and may easily escape from the solder paste, thereby mitigating or preventing a relatively large void from growing on the via pattern. Thus, it may be possible to improve junction reliability of the capacitor.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with some example embodiments.

FIG. 2 is an enlarged cross-sectional view illustrating portion 'A' in FIG. 1.

FIG. 3 is a plan view illustrating first and second capacitor pads in FIG. 2.

FIG. 4 is a perspective view illustrating a capacitor mounted on the first and second capacitor pads in FIG. 2.

FIGS. 5 to 18 are views illustrating stages in a method of manufacturing a semiconductor package in accordance with some example embodiments.

FIG. 19 is a cross-sectional view illustrating a portion of a semiconductor package in accordance with some example embodiments.

FIG. 20 is a plan view illustrating first and second capacitor pads in FIG. 19.

FIG. 21 is a cross-sectional view illustrating a semiconductor package in accordance with some example embodiments.

FIG. 22 is an enlarged cross-sectional view illustrating portion 'C' in FIG. 21.

FIG. 23 is a cross-sectional view illustrating a semiconductor package in accordance with some example embodiments.

FIGS. 24 to 30 are cross-sectional views illustrating stages in a method of manufacturing a semiconductor package in accordance with some example embodiments.

FIG. 31 is a cross-sectional view illustrating a semiconductor package in accordance with some example embodiments.

DETAILED DESCRIPTION

Hereinafter, some example embodiments will be explained in detail with reference to the accompanying drawings.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
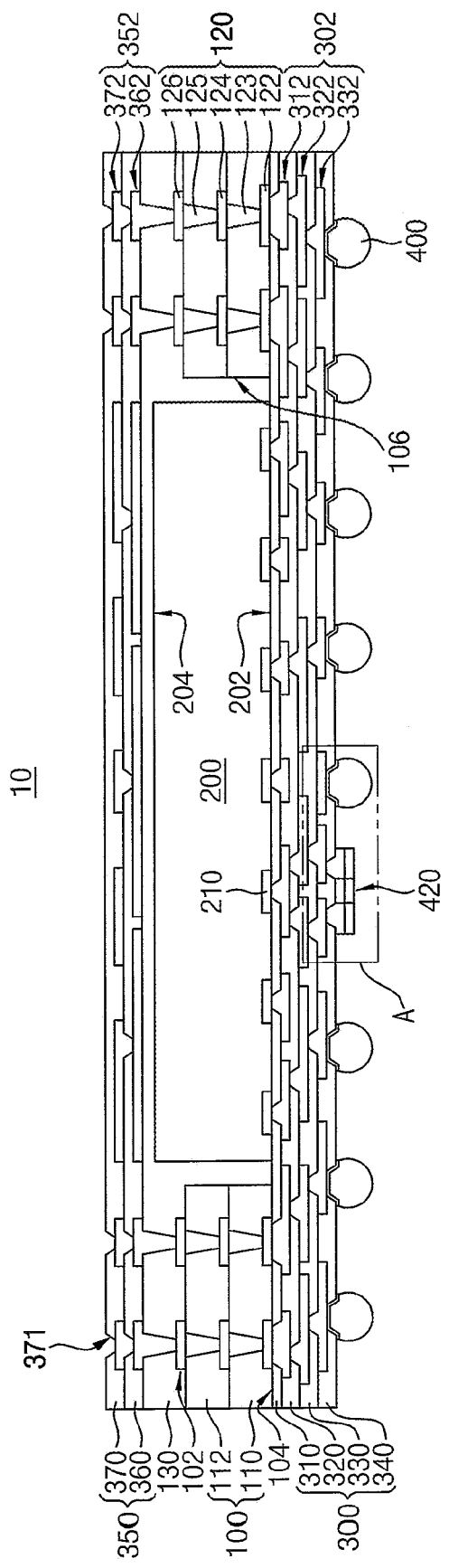
FIGS. 1 to 31 represent non-limiting, example embodiments as described herein.
Figure 2:
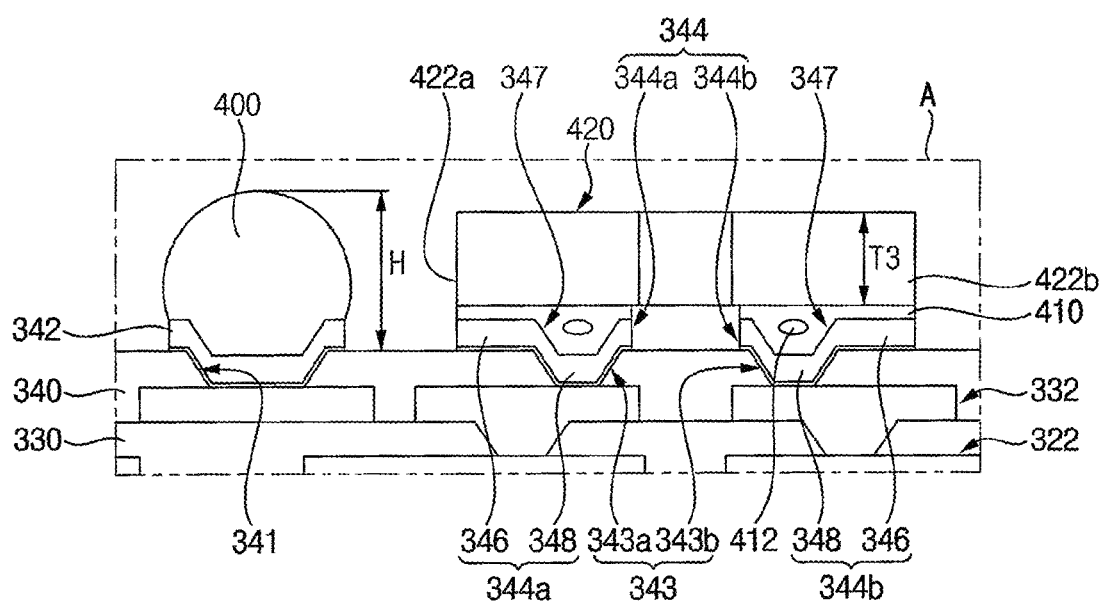
Figure 3:
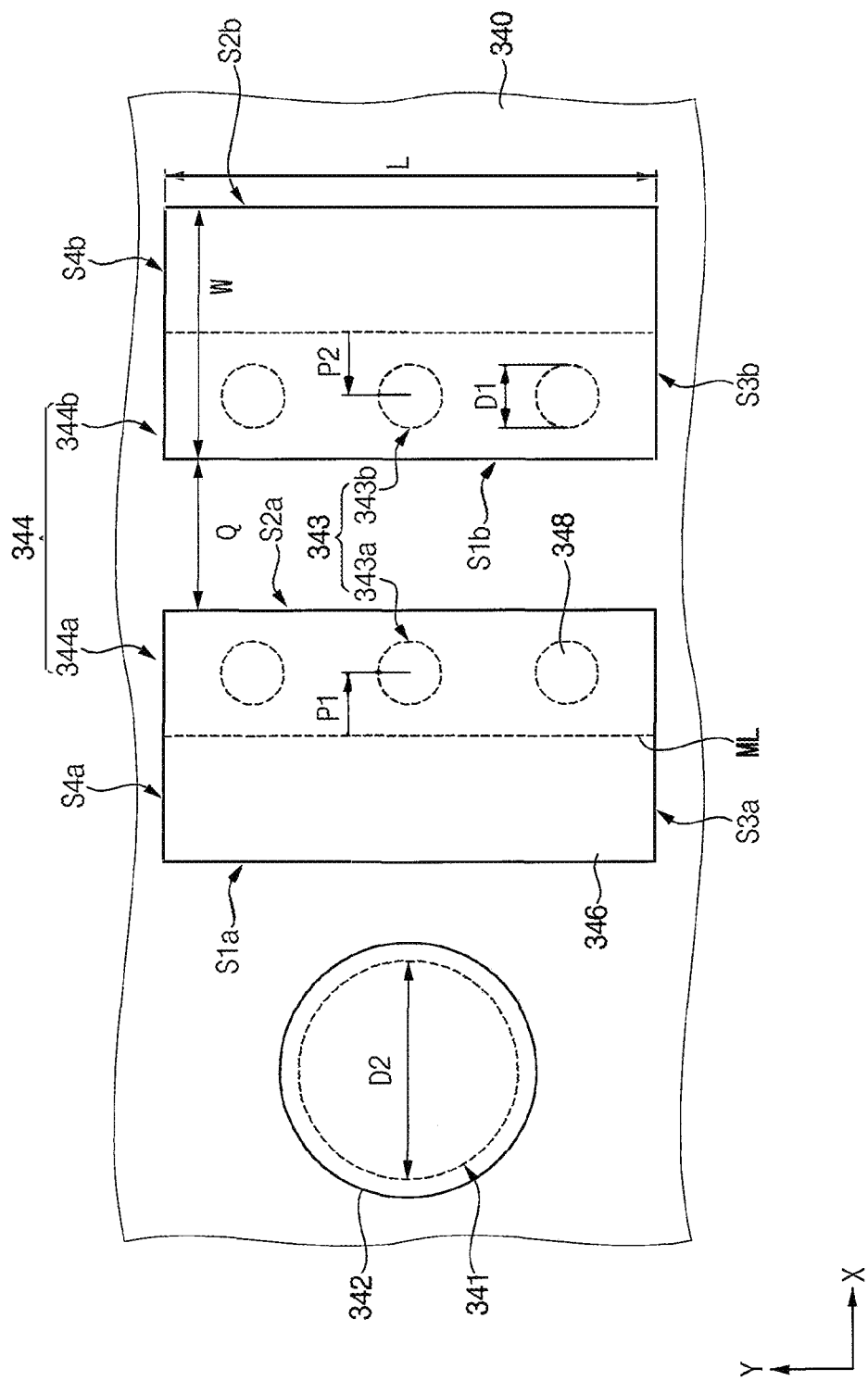
Figure 4:
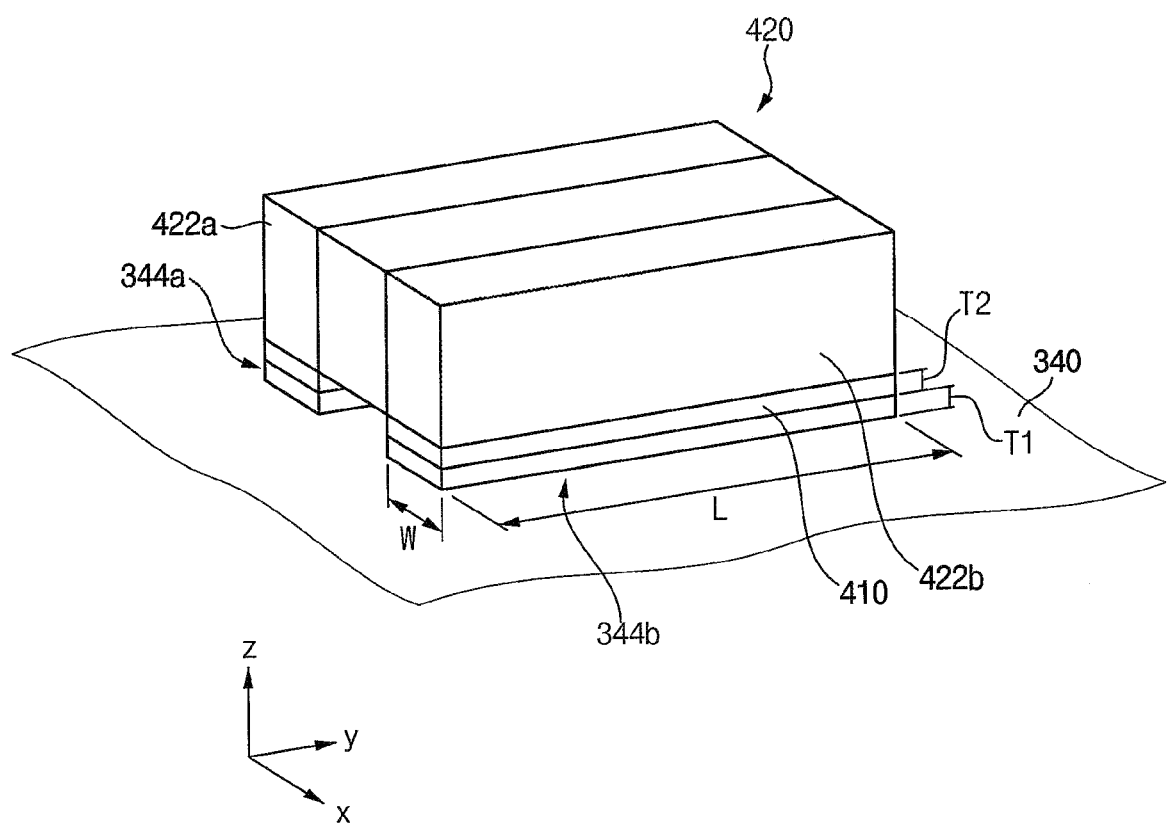

FIG. 1 is a cross-sectional view illustrating a semiconductor package in accordance with some example embodiments. FIG. 2 is an enlarged cross-sectional view illustrating portion 'A' in FIG. 1. FIG. 3 is a plan view illustrating first and second capacitor pads in FIG. 2. FIG. 4 is a perspective view illustrating a capacitor mounted on the first and second capacitor pads in FIG. 2.

Referring to FIGS. 1 to 4, a semiconductor package 10 may include a core substrate 100, at least one semiconductor chip 200 arranged in the core substrate 100, a redistribution wiring layer 300 on a lower surface 104 of the core substrate 100, and at least one capacitor 420 mounted on an outer surface of the redistribution wiring layer 300. Further, the semiconductor package 10 may further include an upper (backside) redistribution wiring layer 350 provided on an upper surface 102 of the core substrate 100 and outer connection members 400 provided on the outer surface of the redistribution wiring layer 300.

In some example embodiments, the semiconductor package 10 may include the core substrate 100 provided as a base substrate which surrounds the semiconductor chip 200. The core substrate 100 may include core connection wirings 120 which are provided in a fan out region outside an area where the semiconductor chip 200 is arranged to function as an electrical connection path with the semiconductor chip 200. Accordingly, the semiconductor package 10 may be provided as a fan-out package. Further, the semiconductor package 10 may be provided as a unit package on which a second package is stacked.

Further, the semiconductor package 10 may be provided as a System In Package (SIP). For example, one or more semiconductor chips may be arranged in the core substrate 100. The semiconductor chip may include a logic chip including logic circuits and/or a memory chip. The logic chip may be a controller to control the memory chip. The memory chip may include various memory circuits such as DRAM, SRAM, flash, PRAM, ReRAM, FeRAM, MRAM, or the like.

In some example embodiments, the core substrate 100 may have a first surface 102 (e.g., an upper surface), and a second surface 104 (e.g., a lower surface) that are opposite to each other. The core substrate 100 may have a cavity 106 in a middle region thereof. The cavity 106 may extend from the first surface 102 to the second surface 104 of the core substrate 100.

The core substrate 100 may include a plurality of stacked insulation layers 110, 112 and the core connection wirings 120 provided as conductive connectors in the insulation layers. A plurality of the core connection wirings 120 may be provided in the fan out region outside an area where the semiconductor chip (die) is disposed, to be used for electrical connection with the semiconductor chip mounted therein.

For example, the core substrate 100 may include a first insulation layer 110 and a second insulation layer 112 stacked on the first insulation layer 110. The core connection wiring 120 may include a first metal wiring 122, a first contact 123, a second metal wiring 124, a second contact 125 and a third metal wiring 126. The first metal wiring 122 may be provided in the second surface 104 of the core substrate 100 (e.g., in a lower surface of the first insulation layer 110), and at least a portion of the first metal wiring 122 may be exposed from the second surface 104. The third metal wiring 126 may be provided in the first surface 102 of the core substrate 100 (e.g., in an upper surface of the second insulation layer 112), and at least a portion of the third metal wiring 126 may be exposed from the first surface 102. It may be understood that the numbers and arrangements of the insulation layers and the core connection wirings may not be limited thereto.

In some example embodiments, the semiconductor chip 200 may be disposed within the cavity 106 of the core substrate 100. A sidewall of the semiconductor chip 200 may be spaced apart from an inner sidewall of the cavity 106. Accordingly, a gap may be formed between the sidewall of the semiconductor chip 200 and the inner sidewall of the cavity 106.

The semiconductor chip 200 may include a substrate and chip pads 210 on an active surface (e.g., a front surface 202 of the substrate). The semiconductor chip 200 may be arranged such that the front surface on which the chip pads 210 are formed faces downward. Accordingly, the chip pads 210 may be exposed from the second surface 104 of the core substrate 100. The front surface of the semiconductor chip 200 may be coplanar with the second surface 104 of the core substrate 100. A backside surface 204 opposite to the front surface 202 of the semiconductor chip 200 may located on a plane higher than the first surface 102 of the core substrate 100.

In some example embodiments, a sealing layer 130 may be provided on the first surface 102 of the core substrate 100 to cover the semiconductor chip 200. The sealing layer 130 may be formed to fill the gap between the sidewall of the semiconductor chip 200 and the inner sidewall of the cavity 106. Accordingly, the sealing layer 130 may cover the backside surface of the semiconductor chip 200, the first surface 102 of the core substrate 100 and the inner sidewall of the cavity 106.

For example, the sealing layer 130 may include a thermosetting insulation material such as epoxy resin, a photo imagable dielectric (PID) material, an insulation film such as Ajinomoto Build-up Film (ABF), etc.

In some example embodiments, the redistribution wiring layer 300 may be arranged on the second surface 104 of the core substrate 100 and the front surface 202 of the semiconductor chip 200. The redistribution wiring layer 300 may include first redistribution wirings 302 electrically connected to the chip pads 210 of the semiconductor chip 200 and the core connection wirings 120, respectively. The first redistribution wirings 302 may be provided on the second surface 104 of the core substrate 100 to function as a front side redistribution wiring. The redistribution wiring layer 300 may be a front redistribution wiring layer of a fan out package.

For example, the redistribution wiring layer 300 may include a first redistribution wiring layer having first lower redistribution wirings 312 provided on a first lower insulation layer 310.

The first lower insulation layer 310 may be provided on the second surface 104 of the core substrate 100 and may have first openings that expose the chip pads 210 of the semiconductor chip 200 and the first metal wirings 122 of the core connection wiring 120, respectively. The first lower redistribution wirings 312 may be provided on the first lower insulation layer 310 and portions of the first lower redistribution wirings 312 may make contact with the chip pads 210 and the first metal wirings 122 through the first openings, respectively.

The redistribution wiring layer 300 may include a second redistribution wiring layer having second lower redistribution wirings 322 provided on a second lower insulation layer 320.

The second lower insulation layer 320 may be provided on the first lower insulation layer 310 and may have second openings that expose the first lower redistribution wirings 312, respectively. The second lower redistribution wirings 322 may be provided on the second lower insulation layer 320 and portions of the second lower redistribution wirings 322 may make contact with the second lower redistribution wirings 322 through the third openings respectively.

The redistribution wiring layer 300 may include a third redistribution wiring layer having third lower redistribution wirings 332 provided on a third lower insulation layer 330.

The third lower insulation layer 330 may be provided on the second lower insulation layer 320 and may have third openings that expose the second lower redistribution wirings 322, respectively. The third lower redistribution wirings 332 may be provided on the third lower insulation layer 330 and portions of the third lower redistribution wirings 322 may make contact with the first lower redistribution wirings 312 through the second openings, respectively.

The redistribution wiring layer 300 may include a fourth lower insulation layer 340 provided on the third lower insulation layer 330 and having fourth openings 341, 343 that expose portions of the third lower redistribution wirings 332.

For example, the first to fourth lower insulation layers may include a polymer layer, a dielectric layer, etc. The first to fourth lower insulation layers may include PID, the insulation film such as ABF, etc. The fourth lower insulation layer may include a material the same as or different from the first to third lower insulation layers. The first to third lower redistribution wirings may include aluminum (Al), copper (Cu), tin (Sn), nickel (Ni), gold (Au), platinum (Pt) or an alloy thereof.

In some example embodiments, the redistribution wiring layer 300 may include solder ball pads 342 and a pair of capacitor pads 344 exposed from an outer surface thereof. The outer connection members 400 may be disposed on the solder ball pads 342, respectively. The capacitor 420 may be mounted on a pair of the capacitor pads 344.

As illustrated in FIGS. 2 to 4, first via holes 341 for electrical connection with the solder ball pads 342 and second via holes 343 for electrical connection with the capacitor pads 344 may be provided in the fourth lower insulation layer 340. The second via holes 343 may include a pair of second via holes 343a, 343b.

The second via holes 343a, 343b may be arranged in a first direction (X direction) to be spaced apart from each other. Three second via holes 343a may be arranged in a second direction (Y direction) perpendicular to the first direction (X direction) to be spaced apart from each other. Three second via holes 343b may be arranged in the second direction (Y direction) to be spaced apart from each other.

A diameter D of each of the second via holes 343a, 343b may be less than a diameter (D2) of the first via hole 341. For example, the diameter D1 of each of the second via holes 343a, 343b may be within a range of 50 μm to 200 μm. The diameter D2 of the first via hole 341 may be within a range of 150 μm to 250 μm. A spacing distance in the second direction between the second via holes 343a and a spacing distance in the second direction between the second via holes 343b may be within a range of 250 μm to 450 μm.

A pair of the capacitor pads 344 may include a first capacitor pad 344a and a second capacitor pad 344b. Each of the first and second capacitor pads 344a, 344b may include a pad pattern 346 and at least one via pattern 348.

The pad pattern 346 may be formed to be exposed from the fourth lower insulation layer 340. The via pattern 348 may be formed in each of the second via holes 343a, 343b. The via pattern 348 may extend downwardly from the pad pattern 346 to make contact with the third lower redistribution wiring 332. The pad pattern 346 may be electrically connected to the third lower redistribution wiring 332 by the via pattern 348.

The pad pattern 346 may have a dimple 347 in an upper portion of the via pattern 348. A diameter of the dimple 347 may be substantially the same as or less than the diameter D1 of the via pattern 348. A thickness T1 of the pad pattern 346 may be within a range of 5 μm to 25 μm. A thickness of the via pattern 348 may be the same as or substantially similar to the thickness of the pad pattern 346.

As illustrated in FIG. 3, the first capacitor pad 344a may include three via patterns 348 connected to one pad pattern 346. The second capacitor pad 344b may include three via patterns 348 connected to one pad pattern 346. Further, the pad pattern 346 may have a shape corresponding to shapes of first and second outer electrodes 422a, 422b of the capacitor 420 mounted thereon. For example, the pad pattern 346 may have a rectangular pad shape having a first side (e.g., a relatively long side) and a second side (e.g., a relatively short side).

The three via patterns 348 may be positioned to be eccentric by a desired (or alternatively, predetermined) distance P (e.g., P1, P2) from a center line ML of the pad pattern 346. The center line ML may pass the midpoint of the short side of the pad pattern 346.

For example, a length of the pad pattern 346 in an extending direction (X direction) of the relatively short side (e.g., a width W of the pad pattern 346) may be within a range of 150 μm to 500 μm. A length of the pad pattern 346 in an extending direction (Y direction) of the relatively long side (e.g., a length L of the pad pattern 346) may be within a range of 600 μm to 1200 μm. The diameter of the via pattern 348 may be 40% or less of the width W of the pad pattern 346. The diameter of the via pattern 348 may be within a range of 50 μm to 200 μm.

The pad patterns 346 of a pair of the capacitor pads 344 may be spaced apart from each other in the first direction (X direction). The spacing distance Q between the pad patterns 346 in the first direction (X direction) may be within a range of 130 μm to 300 μm.

The three via patterns 348 may be spaced apart from each other along the extending direction of the relatively long side (e.g., the second direction (Y direction)) of the pad pattern 346. The spacing distance between the via patterns 348 in the second direction (Y direction) may be within a range of 250 μm to 450 μm. The pad pattern 346 of the first capacitor pad 344a may have two relatively long sides S1a, S2a, and the pad pattern 346 of the second capacitor pad 344b may have two relatively long sides S1b, S2b.

In some example embodiments, the pad pattern 346 of the first capacitor pad 344a and the pad pattern 346 of the second capacitor pad 344b may have the side S2a and the side S1b positioned relatively close to each other. The pad pattern 346 of the first capacitor pad 344a and the pad pattern 346 of the second capacitor pad 344b may have the side Sla and the side S2b positioned relatively far away from each other.

The three via patterns 348 of the first capacitor pad 344a may be positioned to be eccentric toward the side S2a of the pad pattern 346 that is positioned relatively close to the pad pattern 346 of the second capacitor pad 344b. That is, the three via patterns 348 of the first capacitor pad 344a may be arranged adjacent to the side S2a.

The three via patterns 348 of the second capacitor pad 344b may be positioned to be eccentric toward the side S1b of the pad pattern 346 that is positioned relatively close to the pad pattern 346 of the first capacitor pad 344a. That is, the three via patterns 348 of the second capacitor pad 344b may be arranged adjacent to the side S1b.

In some example embodiments, the pad pattern 346 of the first capacitor pad 344a may have relatively short sides S3a, S4a that are opposite to each other, and the pad pattern 346 of the second capacitor pad 344b may have relatively short sides S3b, S4b that are opposite to each other.

The solder ball pad 342 may be formed in each of the first via holes 341. A diameter of the solder ball pad 342 may be greater than the width W of the pad pattern 346. The diameter of the solder ball pad 342 may be within a range of 160 μm to 260 μm.

In some example embodiments, the outer connection members 400 such as solder balls may be disposed on the solder ball pads 342, respectively, and the capacitor 420 may be mounted on a pair of the capacitor pads 344. The first and second outer electrodes 422a, 422b of the capacitor 420 may be attached on the first and second capacitor pads 344a, 344b via conductive pastes 410, respectively.

The capacitor 420 may be a thin film capacitor as a decoupling capacitor. The capacitor 420 may be a Land-Side Capacitor (LSC) type capacitor disposed on the outer surface of the redistribution wiring layer 300 opposite to the semiconductor chip 200.

The conductive paste 410 may include a solder paste. The conductive paste 410 may have a void 412 therein. The void 412 may be located above the dimple 347. A thickness T2 of the conductive paste 410 may be within a range of 5 μm to 15 μm. A thickness T3 of the capacitor 420 may be within a range of 50 μm to 120 μm.

In some example embodiments, the upper redistribution wiring layer 350 may be provided on the first surface 102 of the core substrate 100 and the backside surface 204 of the semiconductor chip 200, and may include second redistribution wirings 352 electrically connected to the core connection wirings 120, respectively. The second redistribution wirings 352 may be provided on the first surface 102 of the core substrate 100 to function as a backside redistribution wiring. Accordingly, the upper redistribution wiring layer may be a backside redistribution wiring layer.

For example, the upper redistribution wiring layer 350 may include a first upper insulation layer 360 that covers first upper redistribution wirings 362 electrically connected to the core connection wirings 120. The first upper redistribution wirings 362 may be provided on the sealing layer 130 and may be electrically connected to the core connection wirings 120.

The upper redistribution wiring layer 350 may include a second upper insulation layer 370 that covers second upper redistribution wirings 372. The second upper redistribution wirings 372 may be provided on the first upper insulation layer 360 and may be electrically connected to the first upper redistribution wirings 362. The second upper insulation layer 370 may have openings 371 that expose the second upper redistribution wirings 372.

For example, the first and second upper insulation layers may include a thermosetting insulation material (e.g., epoxy resin), a photo imagable dielectric (PID) material, an insulation film such as Ajinomoto Build-up Film (ABF), etc. The first and second lower redistribution wirings may include aluminum (Al), copper (Cu), tin (Sn), nickel (Ni), gold (Au), platinum (Pt) or an alloy thereof.

In some example embodiments, the outer connection members 400 may include solder balls. The solder ball may have a diameter of 180 μm to 250 μm. The semiconductor package 10 may be mounted on a module substrate (not illustrated) via the solder balls to form a memory module.

As mentioned above, the semiconductor package 10 as the fan-out panel level package may include the redistribution wiring layer 300 covering the second surface 104 of the core substrate 100 and the at least one capacitor 420 mounted on the outer surface of the redistribution wiring layer 300. The redistribution wiring layer 300 may include a pair of the capacitor pads 344 exposed to the outer surface thereof, and the first and second outer electrodes 422a, 422b of the capacitor 420 may be mounted on a pair of the capacitor pads 344 via the conductive pastes 410. Each of the capacitor pads 344 may include the pad pattern 346 and the at least one via pattern 348. The via pattern 348 may be positioned to be eccentric by the desired (or alternatively, predetermined) distance P from the center line ML of the pad pattern 346. The diameter D1 of the via pattern 348 may be 40% or less of the width W of the pad pattern 346.

Because the via pattern 348 is located eccentric from the center of the pad pattern 346 and the via pattern 348 has a relatively small diameter, a flux gas generated from the solder paste may move to an edge region of the pad pattern 346 and may easily escape from the solder paste. Thus, it may be possible to improve junction reliability of the capacitor 420.

Hereinafter, a method of manufacturing the semiconductor package in FIG. 1 will be explained.

Figure 5:
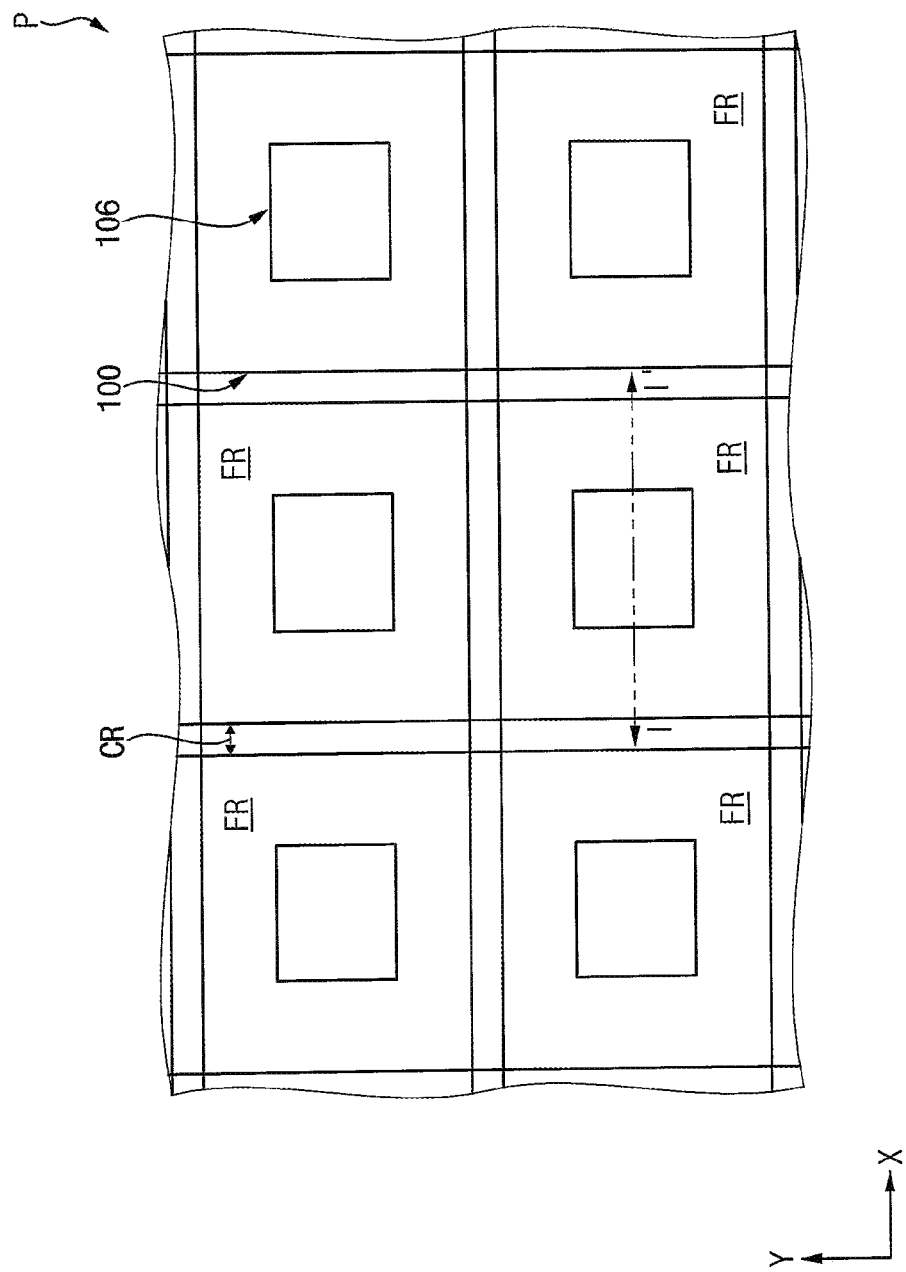
Figure 10:
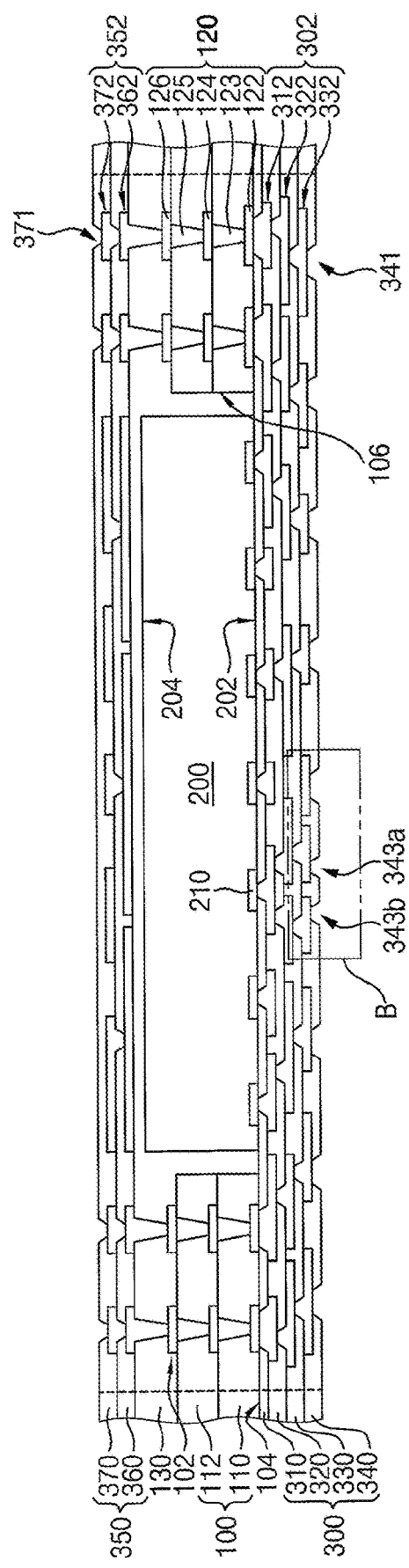
Figure 11:
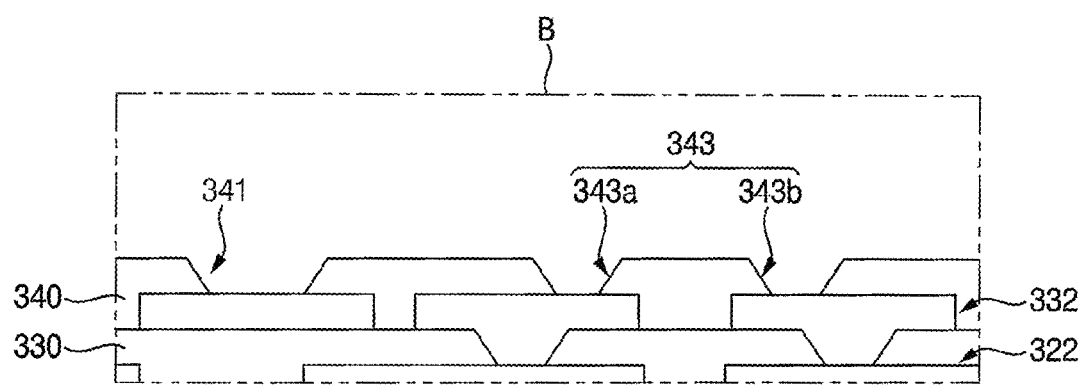
Figure 12:
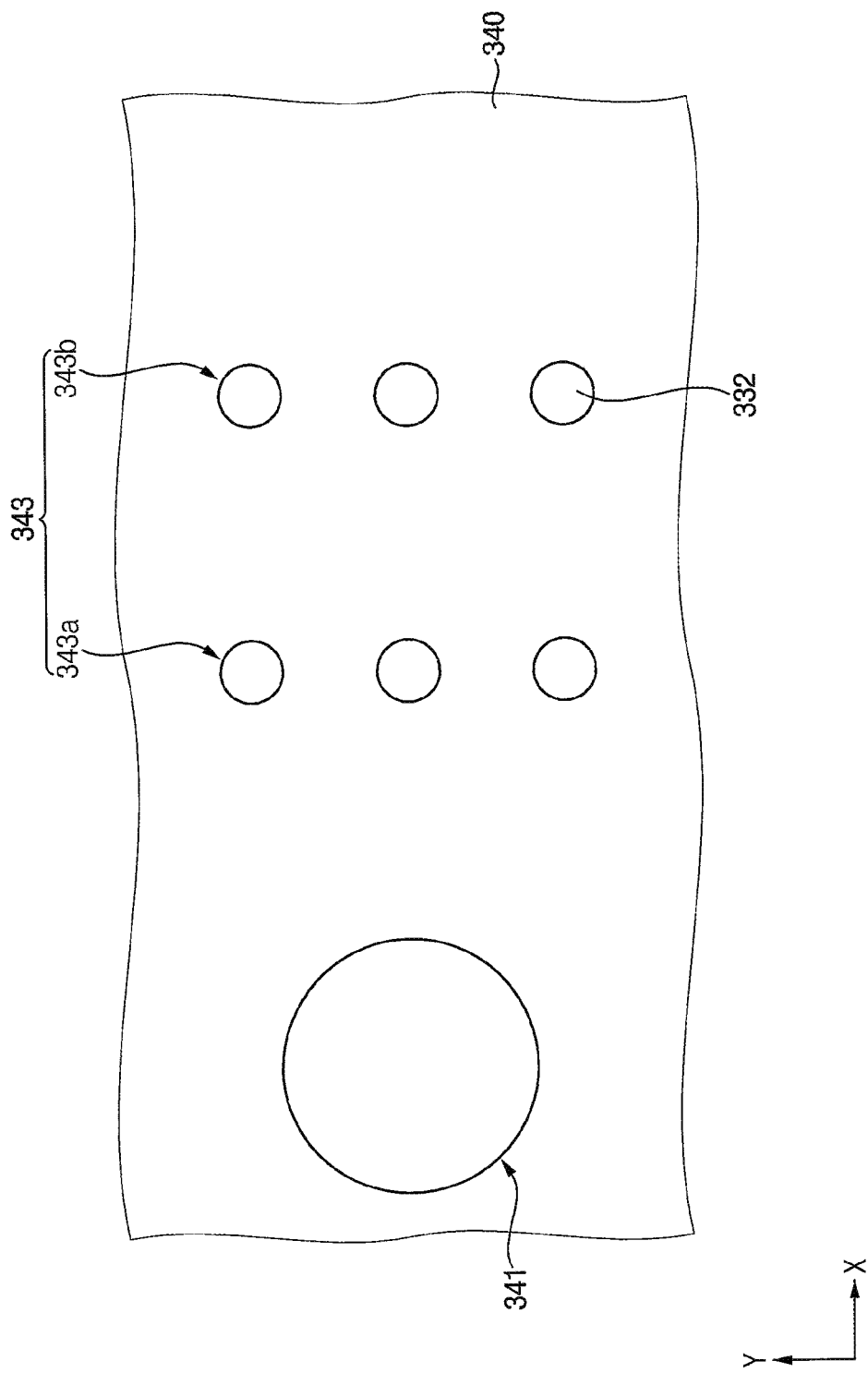

FIGS. 5 to 18 are views illustrating stages in a method of manufacturing a semiconductor package in accordance with some example embodiments. FIG. 5 is a plan view illustrating a panel having a plurality of core substrates formed therein. FIGS. 6 to 10 and 17 are cross-sectional views taken along the line I-I' in FIG. 5. FIGS. 11 and 13 to 15 are enlarged cross-sectional views illustrating portion 'B' in FIG. 10, and FIG. 18 is an enlarged cross-sectional view illustrating portion 'B' in FIG. 17. FIG. 12 is a plan view of FIG. 11, and FIG. 16 is a plan view of FIG. 15.

Figure 6:
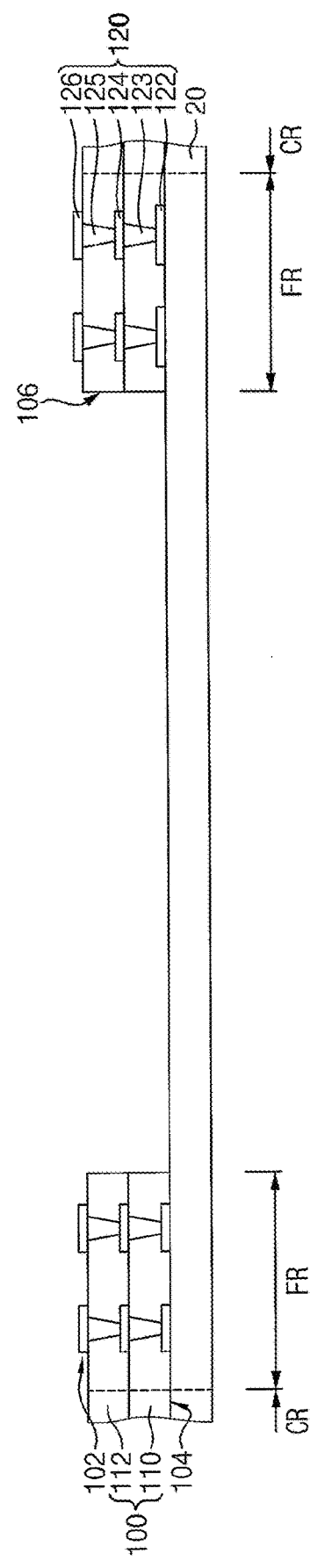
Figure 7:
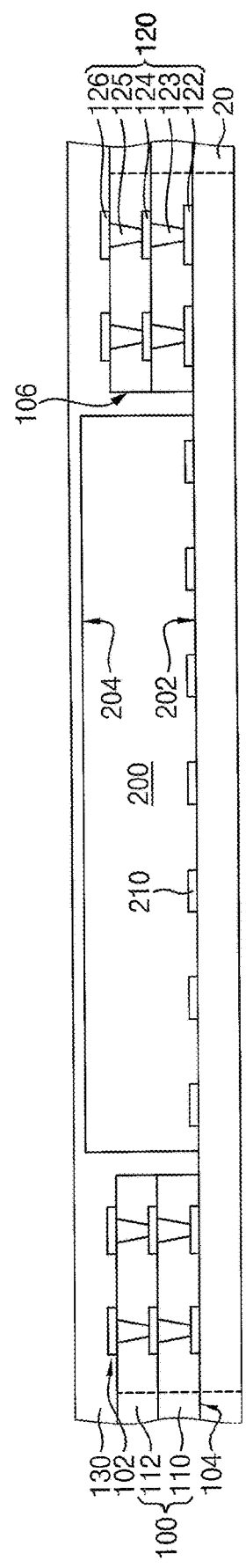

Referring to FIGS. 5 to 7, a panel P having a plurality of core substrates 100 formed therein may be prepared, a semiconductor chip 200 may be arranged within a cavity 106 of the core substrate 100, and then, a sealing layer 130 may be formed to cover the semiconductor chip 200.

In some example embodiments, the core substrate 100 may be used as a support frame for electrical connection for manufacturing a semiconductor package having a fan-out panel level package configuration.

As illustrated in FIG. 5, the panel P may include a frame region FR on which the core substrate 100 is formed and a scribe lane region (e.g., a cutting region CA) surrounding the frame region FR. As described later, the panel P may be sawed along the cutting region CA dividing the frame regions FR to form an individual core substrate 100.

The core substrate 100 may have a first surface 102 and a second surface 104 opposite to each other. The core substrate 100 may have the cavity 106 in a middle region of the frame region FR. As described later, the cavity 106 may have an area for receiving at least one semiconductor chip.

The core substrate 100 may include a plurality of stacked insulation layers 110, 112 and core connection wirings 120 provided as conductive conductors in the insulation layers. A plurality of the core connection wirings 120 may be provided to penetrate through the core substrate 100 from the first surface 102 to the second surface 104 of the core substrate 100 to function as an electrical connection path. That is, the core connection wirings 120 may be provided in a fan out region outside an area where the semiconductor chip (die) is disposed to be used for electrical connection with the semiconductor chip mounted therein. For example, the core connection wiring 120 may include a first metal wiring 122, a first contact 123, a second metal wiring 124, a second contact 125 and a third metal wiring 126.

As illustrated in FIG. 6, the panel P may be arranged on a barrier tape (or alternatively, a carrier tape) 20, and the at least one semiconductor chip 200 may be disposed within the cavity 106 of the core substrate 100.

The second surface 104 of the core substrate 100 may be adhered on the barrier tape 20. For example, about 200 to about 6,000 dies (chips) may be arranged in the cavities 106 of the panel P, respectively. As described later, a singulation or sawing process may be performed to saw the panel P to complete a fan-out panel level package. In some example embodiments, a plurality of semiconductor chips 200 may be arranged within one cavity 106.

The semiconductor chip 200 may include a substrate and chip pads 210 on a front surface (e.g., a first surface) of the substrate. The semiconductor chip 200 may be arranged such that the first surface on which the chip pads 210 are formed faces downward. The front surface of the semiconductor chip 200 may be coplanar with the second surface 104 of the core substrate 100.

The semiconductor chip 200 may be disposed within the cavity 106 of the core substrate 100. A sidewall of the semiconductor chip 200 may be spaced apart from an inner sidewall of the cavity 106. Accordingly, a gap may be formed between the sidewall of the semiconductor chip 200 and the inner sidewall of the cavity 106.

A thickness of the semiconductor chip 200 may be greater than a thickness of the core substrate 100. Accordingly, a backside surface 204 of the semiconductor chip 200 may be positioned higher than the first surface 102 of the core substrate 100. Alternatively, the thickness of the semiconductor chip 200 may be the same as or less than the thickness of the core substrate 100. In this case, the backside surface 204 of the core substrate 100 may be coplanar with or positioned lower than the first surface 102 of the core substrate 100.

As illustrated in FIG. 7, the sealing layer 130 may be formed on the first surface 102 of the core substrate 100 to cover the semiconductor chip 200. The sealing layer 130 may be formed to fill the gap between the sidewall of the semiconductor chip 200 and the inner sidewall of the cavity 106. Accordingly, the sealing layer 130 may cover the backside surface 204 of the semiconductor chip 200, the first surface 102 of the core substrate 100 and the inner sidewall of the cavity 106.

For example, the sealing layer 130 may include a thermosetting insulation material (e.g., epoxy resin), a photo imagable dielectric (PID) material, an insulation film (e.g., Ajinomoto Build-up Film (ABF)), etc. In case that the sealing layer 130 includes the insulation film such as ABF, the sealing layer 130 may be formed by a lamination process.

Figure 8:
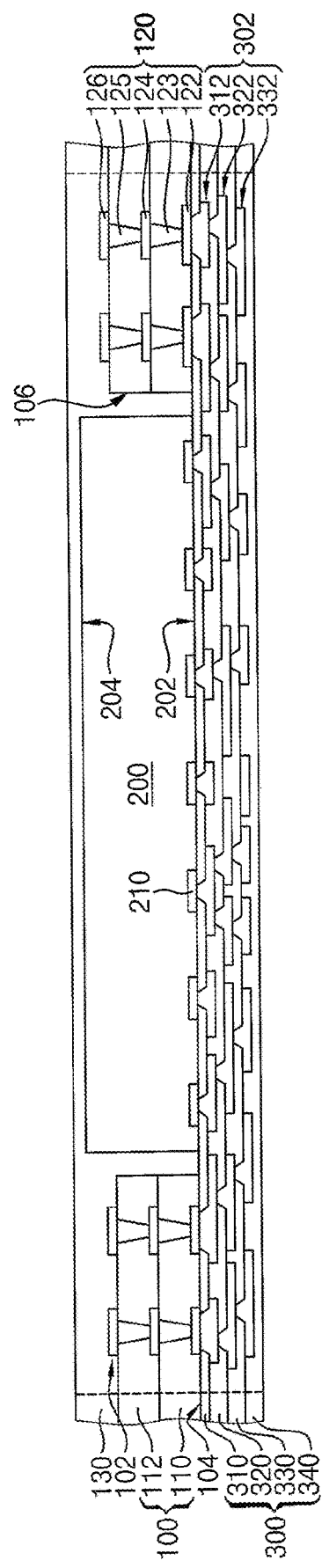

Referring to FIG. 8, a redistribution wiring layer 300 may be formed on the second surface 104 of the core substrate 100 and the front surface 202 of the semiconductor chip 200. The redistribution wiring layer 300 may include first redistribution wirings 302 electrically connected to the chip pads 210 of the semiconductor chip 200 and the core connection wirings 120, respectively. The redistribution wiring layer 300 may be a front redistribution wiring layer of a fan out package.

For example, after removing the barrier tape 20, the structure in FIG. 7 may be reversed, and the sealing layer 130 may be adhered on a first carrier substrate (not illustrated). Then, a first lower insulation layer 310 may be formed to cover the second surface 104 of the core substrate 100 and the front surface 202 of the semiconductor chip 200, and then, the first lower insulation layer 310 may be patterned to form openings that expose the chip pads 210 of the semiconductor chip 200 and the first metal wirings 122 of the core connection wiring 120 respectively.

For example, the first lower insulation layer 310 may include a polymer layer, a dielectric layer, etc. The first lower insulation layer 310 may include PID, the insulation film such as ABF, etc. The first lower insulation layer 310 may be formed by a vapor deposition process, a spin coating process, etc.

Then, first lower redistribution wirings 312 may be formed on the first lower insulation layer 310. The first lower redistribution wirings 312 may make contact with the chip pads 210 through the openings, respectively.

The first lower redistribution wirings 312 may be formed by forming a seed layer on a portion of the first lower insulation layer 310 and in the first opening, patterning the seed layer and performing an electro plating process. Accordingly, at least portions of the first lower redistribution wirings 312 may make contact with the chip pads 210 and the first metal wirings 122 through the openings.

For example, the first lower redistribution wiring may include aluminum (Al), copper (Cu), tin (Sn), nickel (Ni), gold (Au), platinum (Pt) or an alloy thereof.

Similarly, a second lower insulation layer 320 may be formed on the first lower insulation layer 310, and then, the second lower insulation layer 320 may be patterned to form openings that expose the first lower redistribution wirings 312, respectively. Then, second lower redistribution wirings 322 may be formed on the second lower insulation layer 320 to make contact with the first lower redistribution wirings 312 through the openings, respectively.

Then, a third lower insulation layer 330 may be formed on the second lower insulation layer 320, and then, the third lower insulation layer 330 may be patterned to form openings that expose the second lower redistribution wirings 322, respectively. Then, third lower redistribution wirings 332 may be formed on the third lower insulation layer 330 to make contact with the second lower redistribution wirings 322 through the openings, respectively. Then, a fourth lower insulation layer 340 may be formed on the third lower insulation layer 330 to expose portions of the third lower redistribution wirings 332.

The fourth lower insulation layer 340 may serve as a passivation layer. As described later, the fourth lower insulation layer 340 may be partially removed to expose portions of the third lower redistribution wirings 332 by a following via forming process. Further, a bump pad (not illustrated) such as UBM (Under Bump Metallurgy) may be formed on the portion of the third lower redistribution wiring 332 exposed by the fourth lower insulation layer 340.

The fourth lower insulation layer 340 may include a photo imagable dielectric (PID) material, an insulation film, e.g., ABF, etc. The fourth lower insulation layer may include a material the same as or different from the first to third lower insulation layers.

Figure 9:
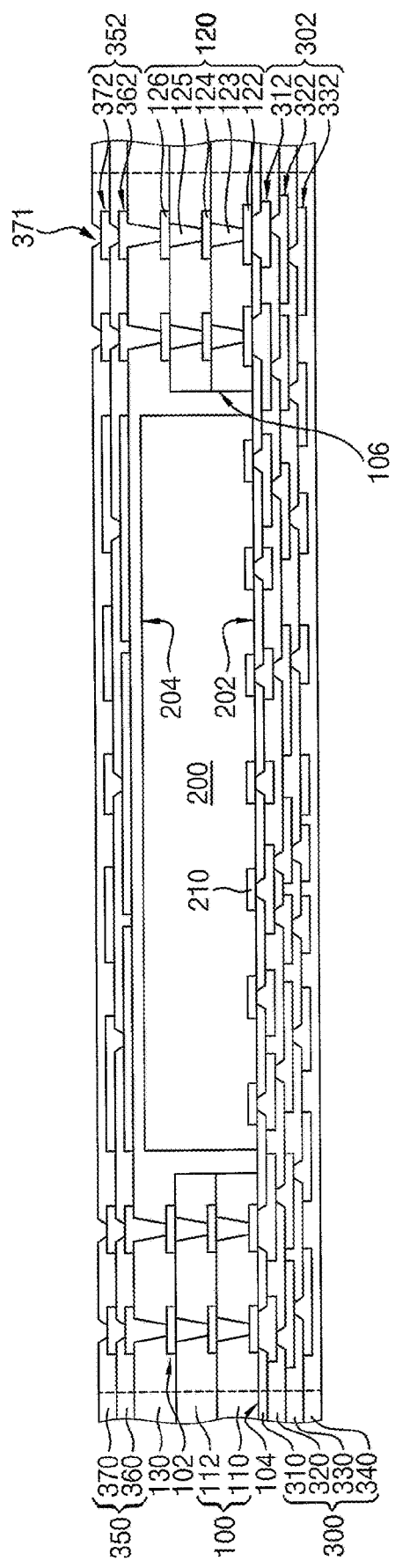

Referring to FIG. 9, an upper redistribution wiring layer 350 may be formed on the sealing layer 130 on the first surface 102 of the core substrate 100 and the backside surface 204 of the semiconductor chip 200. The upper redistribution wiring layer 350 may include second redistribution wirings 352 electrically connected to the core connection wiring 120. The upper redistribution wiring layer 350 may be a backside redistribution wiring layer of the fan out package.

For example, after removing the first carrier substrate, the redistribution wiring layer 300 may be adhered on a second carrier substrate (not illustrated). Then, after the sealing layer 130 on the first surface 102 of the core substrate 100 is partially removed to form openings that expose the third metal wirings 126 of the core connection wirings 120, first upper redistribution wirings 362 may be formed on the sealing layer 130. The first upper redistribution wirings 362 may be electrically connected to the core connection wirings 120 through the openings.

Then, a first upper insulation layer 360 may be formed on the sealing layer 130 to cover the first upper redistribution wirings 362, and then, the first upper insulation layer 360 may be patterned to form openings that expose the first upper redistribution wirings 362, respectively. Then, second upper redistribution wirings 372 may be formed on the first upper insulation layer 360 to make contact with the first upper redistribution wirings 362 through the openings, respectively.

Then, a second upper insulation layer 370 may be formed on the first upper insulation layer 360 to cover the second upper redistribution wirings 372, and then, the second upper insulation layer 370 may be patterned to form openings 371 that expose the second upper redistribution wirings 372, respectively.

The second upper insulation layer 370 may serve as a passivation layer. A bump pad (not illustrated) such as UBM (Under Bump Metallurgy) may be formed on a portion of the second upper redistribution wiring 372 exposed by the second upper insulation layer 370 by a following pad forming process.

For example, the first and second upper insulation layers may include a thermosetting insulation material (e.g., epoxy resin), a photo imagable dielectric (PID) material, an insulation film (e.g., ABF), etc.

Referring to FIGS. 10 to 18, outer connection members 400 and a capacitor 420 may be mounted on an outer surface of the redistribution wiring layer 300.

As illustrated in FIGS. 10 and 11, the fourth lower insulation layer 340 may be patterned to form openings 341, 343 that expose portions of the third lower redistribution wirings 332 respectively.

The openings may include first via holes 341 for electrical connection with solder ball pads and second via holes 343 for electrical connection with capacitor pads. The second via holes 343 may include a pair of second via holes 343a, 343b.

As illustrated in FIG. 12, the second via holes 343a, 343b may be arranged in a first direction to be spaced apart from each other. Three second via holes 343a may be arranged in a second direction perpendicular to the first direction to be spaced apart from each other. Through second via holes 343b may be arranged in the second direction to be spaced apart from each other.

A diameter of each of the second via holes 343a, 343b may be less than a diameter of the first via hole 341. For example, the diameter of each of the second via holes 343a, 343b may be within a range of 50 μm to 200 μm. The diameter of the first via hole 341 may be within a range of 150 μm to 250 μm. A spacing distance in the second direction between the second via holes 343a and a spacing distance in the second direction between the second via holes 343b may be within a range of 250 μm to 450 μm.

The second via holes 343a, 343b may be formed in the fourth lower insulation layer 340. In some example embodiments, the second via holes 343a, 343b may be formed in the fourth and third lower insulation layers 340, 330 to expose a portion of the second lower redistribution wiring 322. In some other example embodiments, the second via holes 343a, 343b may be formed in the fourth to second lower insulation layers 340, 330, 320 to expose a portion of the first lower redistribution wiring 312.

Figure 13:
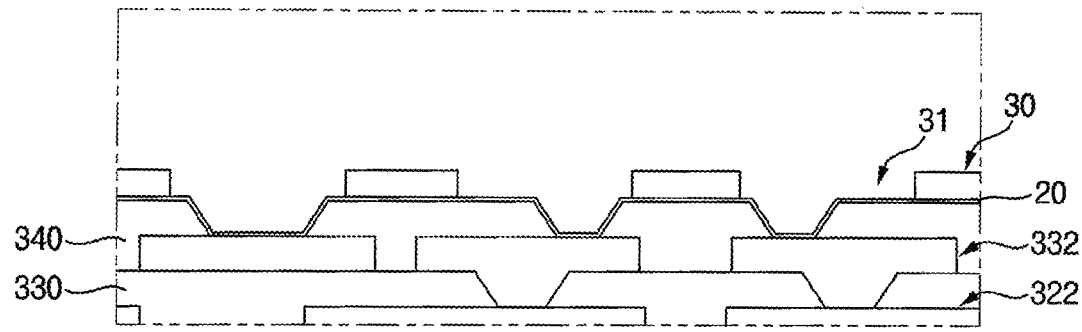

As illustrated in FIG. 13, a seed layer 20 may be formed on the fourth lower insulation layer 340, and a photoresist pattern 30 having openings 31 that expose portions of the seed layer 20 on the third lower redistribution wirings 332 may be formed on the seed layer 20.

For example, the seed layer 370 may include an alloy layer including titanium/copper (Ti/Cu), titanium/palladium (Ti/Pd), titanium/nickel (Ti/Ni), chromium/copper (Cr/Cu) or a combination thereof. The seed layer 20 may be formed by a sputtering process.

A photoresist layer may be formed on the fourth lower insulation layer 340 to cover the seed layer 22. For example, a thickness of the photoresist layer may be within a range of 5 μm to 25 μm. The thickness of the photoresist layer may be determined in consideration of the thickness of the UBM pad, etc.

Then, an exposure process may be performed on the photoresist layer to form the photoresist pattern 30 having the opening 32 that expose a solder ball pad region and a capacitor pad region.

Figure 14:
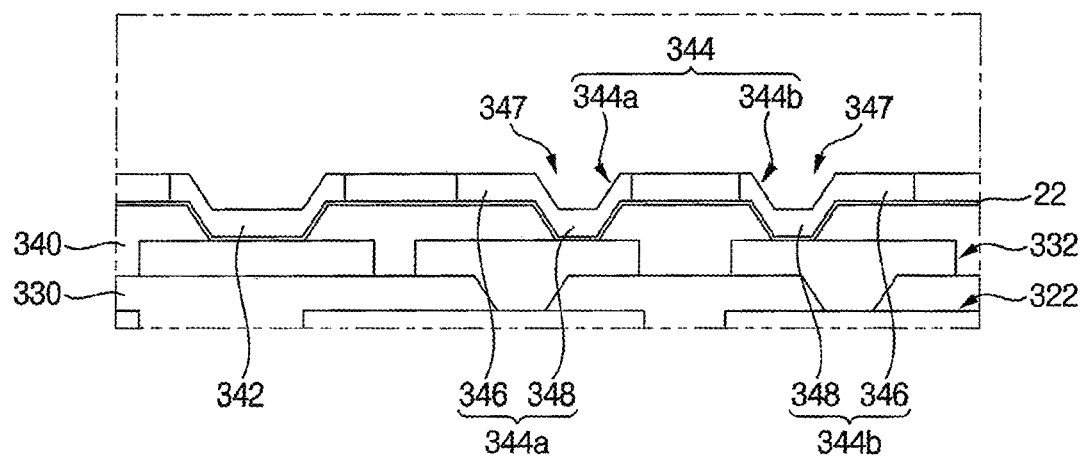
Figure 15:
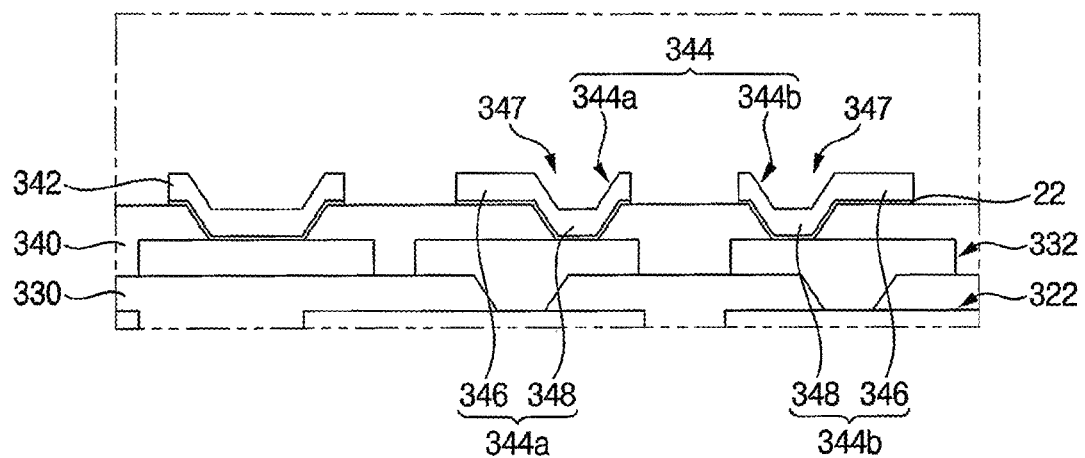
Figure 16:
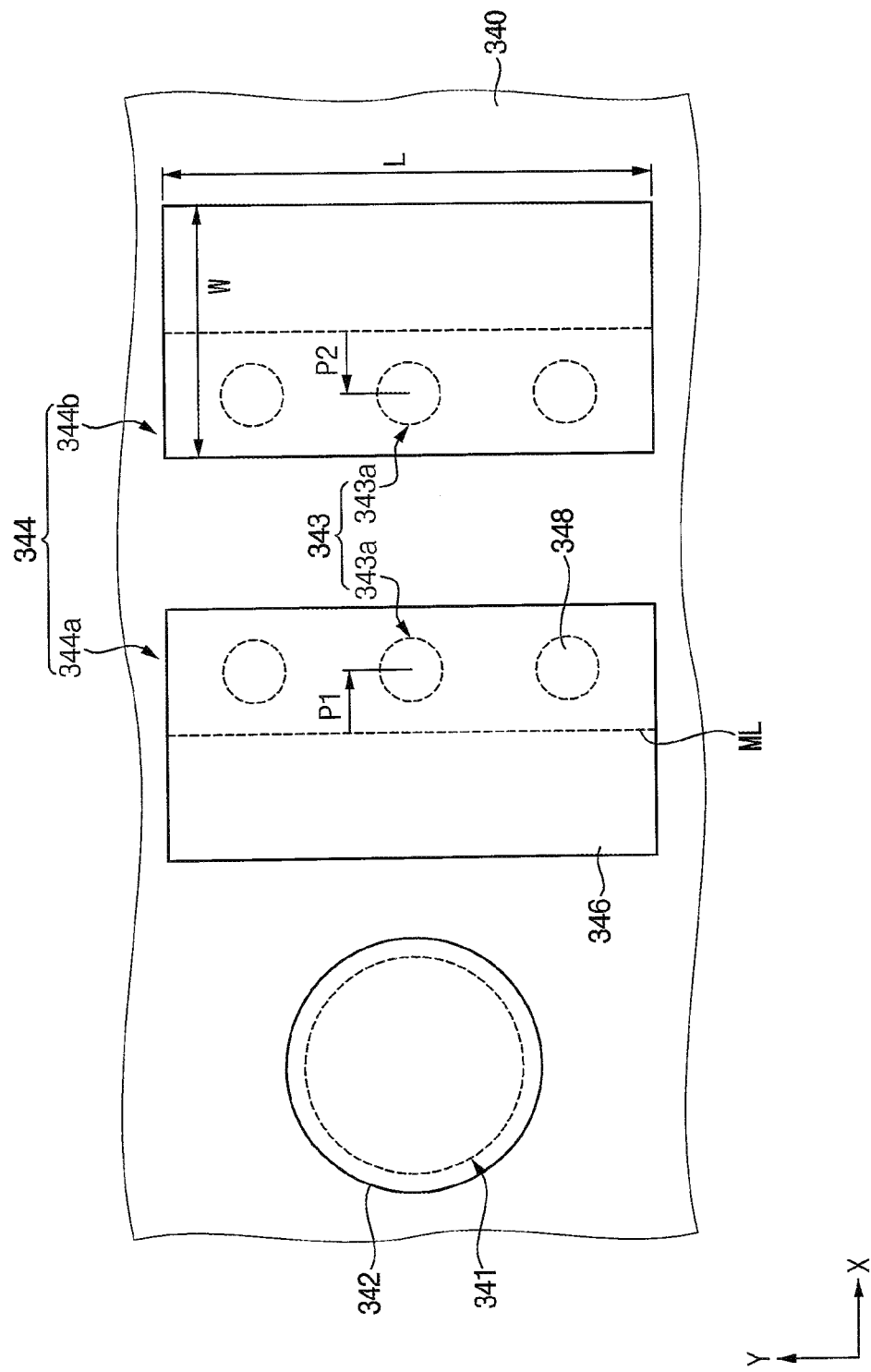

As illustrate in FIGS. 14 to 16, a plating process may be performed on the seed layer 20 to form a solder ball pad 342 and a pair of capacitor pads 344. Then, the photoresist pattern 30 may be removed and the seed layer 30 under the photoresist pattern 30 may be partially removed to form a seed layer pattern 22.

A pair of the capacitor pads 344 may include a first capacitor pad 344a and a second capacitor pad 344b. Each of the first and second capacitor pads 344a, 344b may include a pad pattern 346 and at least one via pattern 348.

The pad pattern 346 may be exposed from the fourth lower insulation layer 340. The via pattern 348 may be formed in each of the second via holes 343a, 343b. The via pattern 348 may extend downwardly from the pad pattern 346 to make contact with the third lower redistribution wiring 332. The pad pattern 346 may be electrically connected to the third lower redistribution wiring 332 by the via pattern 348.

Because the seed layer 20 is formed conformally on the portion of the fourth lower insulation layer 340 and the exposed portion of the third lower redistribution wiring 332, the pad pattern 346 may have a dimple 347 in an upper portion of the via pattern 348. A diameter of the dimple 347 may be substantially the same as or less than a diameter of the via pattern 348. A depth of the dimple 347 may be the same as or less than a thickness of the via pattern 348.

As illustrated in FIG. 16, the first capacitor pad 344a may include three via patterns 348 connected to one pad pattern 346. The second capacitor pad 344b may include three via patterns 348 connected to one pad pattern 346. Further, the pad pattern 346 may have a shape corresponding to shapes of first and second outer electrodes of a capacitor mounted thereon. For example, the pad pattern 346 may have a rectangular pad shape having a first side (relatively long side) and a second side (relatively short side).

The three via patterns 348 may be positioned to be eccentric by a desired (or alternatively, predetermined) distance P from a center line ML of the pad pattern 346. The center line ML may pass the midpoint of the short side of the pad pattern 346.

For example, a length of the pad pattern 346 in an extending direction of the short side, i.e., a width W of the pad pattern 346 may be within a range of 150 μm to 500 μm.

A length of the pad pattern 346 in an extending direction of the long side, i.e., a length L of the pad pattern 346 may be within a range of 600 μm to 1200 μm. The diameter of the via pattern 348 may be 40% or less of the width W of the pad pattern 346. The diameter of the via pattern 348 may be within a range of 50 μm to 200 μm.

The pad patterns 346 of a pair of the capacitor pads 344 may be spaced apart from each other in the first direction. The spacing distance Q between the pad patterns 346 in the first direction may be within a range of 130 μm to 300 μm.

The three via patterns 348 may be spaced apart from each other along the extending direction of the relatively long side (e.g., the second direction) of the pad pattern 346. The spacing distance between the via patterns 348 in the second direction may be within a range of 250 μm to 450 μm.

A diameter of the solder ball pad 342 may be greater than the width W of the pad pattern 346. The diameter of the solder ball pad 342 may be within a range of 160 μm to 260 μm.

Figure 17:
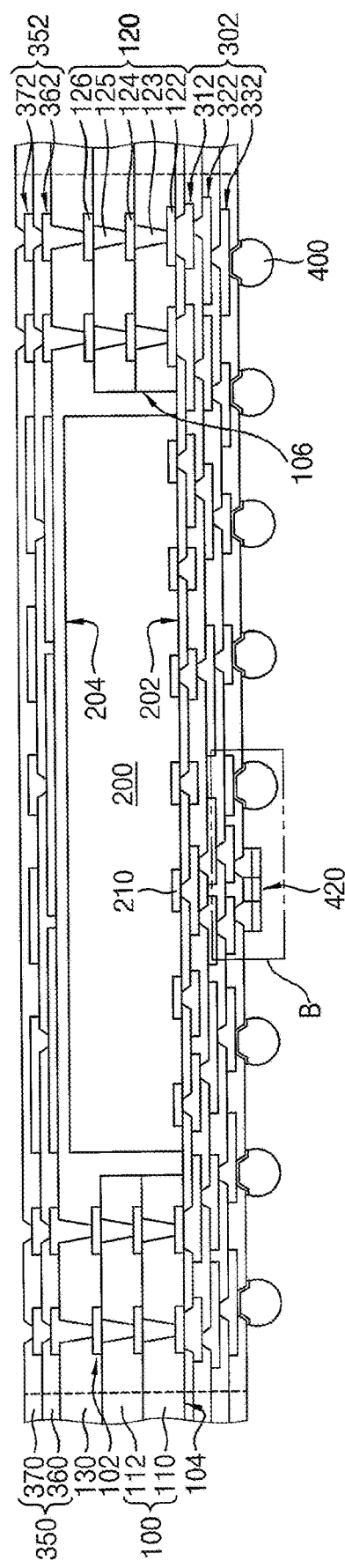
Figure 18:
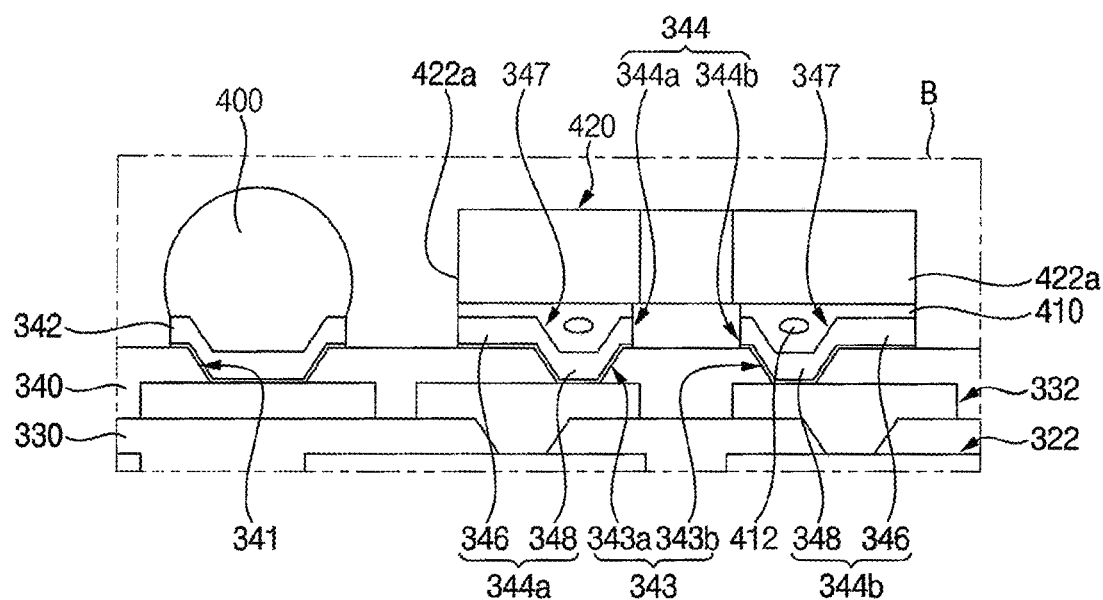

As illustrated in FIGS. 17 and 18, the outer connection members 400 may be disposed on the solder ball pads 342 respectively and the capacitor 420 may be mounted on a pair of the capacitor pads 344.

For example, conductive pastes 410 such as solder pastes may be coated on the first and second capacitor pads 344a, 344b, a flux may be coated on the solder ball pad 342, and then, the outer connection members such as solder balls 400 may be disposed. Then, the first and second outer electrodes 422a, 422b of the capacitor 420 may be attached on the first and second capacitor pads 344a, 344b via the conductive pastes 410.

After attaching the first and second outer electrodes 422a, 422b of the capacitor 420 on the first and second capacitor pads 344a, 344b, a reflow process may be performed to attach the first and second outer electrodes 422a, 422b on the first and second capacitor pads 344a, 344b. During the reflow process, a flux gas may be generated from the solder paste, and a portion of the generated gas may form a void 412 in the conductive paste on the dimple 347.

Because the via pattern 348 is located eccentric from the center of the pad pattern 346, the generated flux gas may move to an edge of the pad pattern 346 and may easily escape. Further, because the via pattern 348 has a relatively small diameter, the void may be mitigated or prevented from growing in a large size above the via pattern 348. Accordingly, a phenomenon that the flux gas is collected at the center of the void pad pattern 346 may be mitigated or prevented, and the void 412 may be formed in a small size at the edge portion of the pad pattern 346 rather than at the center.

Then, a sawing process may be performed on the core substrate 100 to form an individual fan-out panel level package including the core substrate 100, the redistribution wiring layer 300 formed on the lower surface of the core substrate 100 and the capacitor 420 mounted on the outer surface of the redistribution wiring layer 300.

Figure 19:
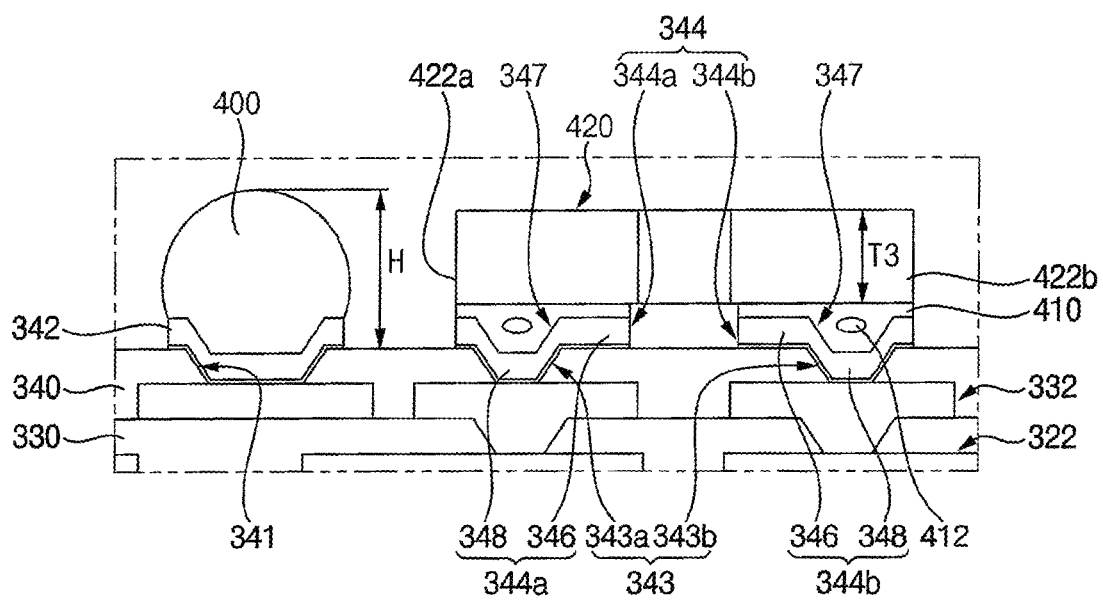
Figure 20:
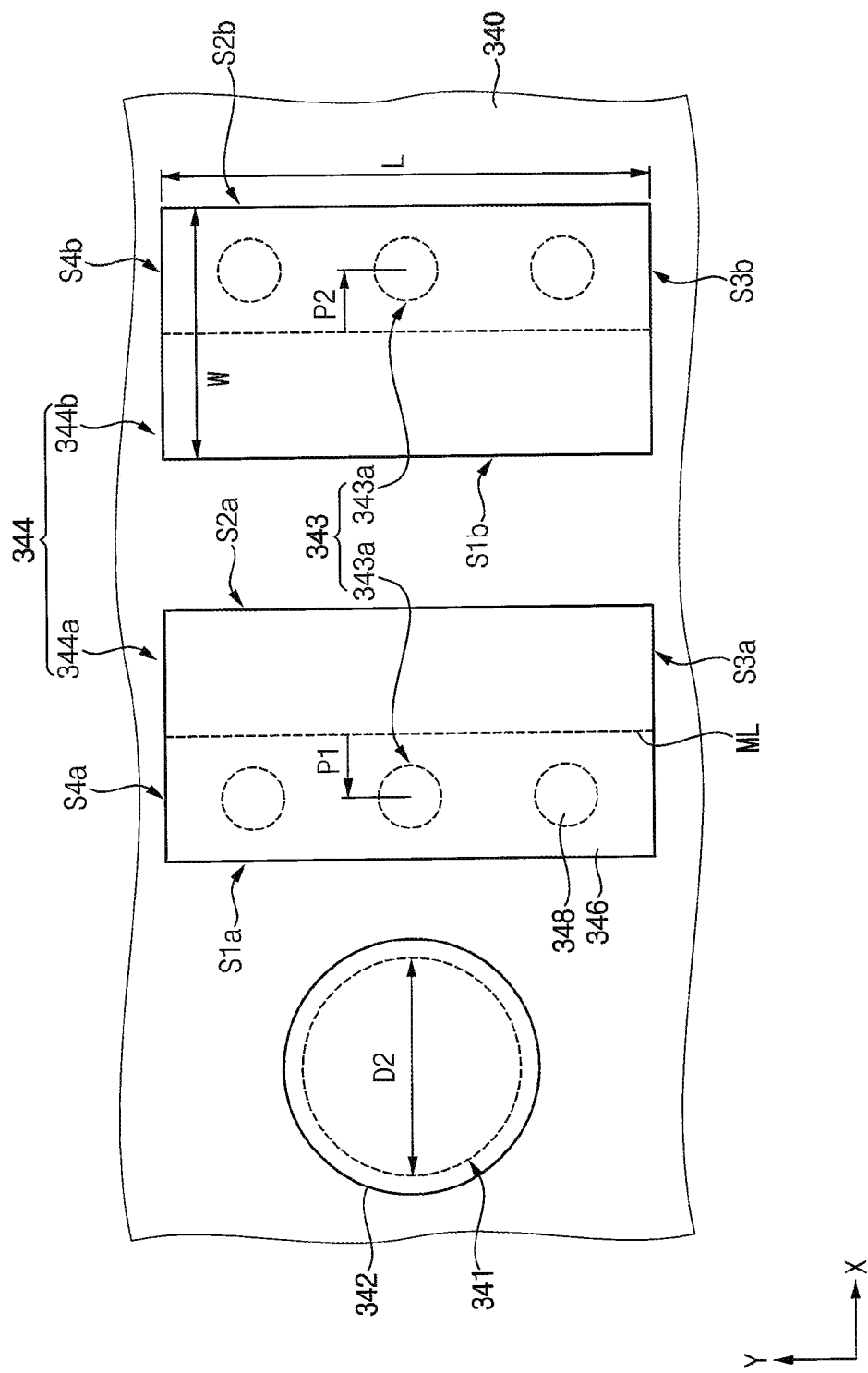

FIG. 19 is a cross-sectional view illustrating a portion of a semiconductor package in accordance with some example embodiments. FIG. 20 is a plan view illustrating first and second capacitor pads in FIG. 19. The semiconductor package may be the same as or substantially similar to the semiconductor package described with reference to FIG. 1 except for an arrangement of via patterns. Thus, same reference numerals will be used to refer to the same or like elements and any further repetitive explanation concerning the above elements will be omitted.

In some example embodiments, a pad pattern 346 of a first capacitor pad 344a and a pad pattern 346 of a second capacitor pad 344b may be spaced apart from each other in a first direction (X direction). Three via patterns 348 may be positioned to be eccentric by a desired (or alternatively, predetermined) distance P from a center line ML of the pad pattern 346. The center line ML may pass the midpoint of a short side of the pad pattern 346. Three via patterns 348 may be spaced apart along an extending direction of a relatively long side of the pad pattern 346 (e.g., a second direction (Y direction)). The pad pattern 346 of the first capacitor pad 344a may have two relatively long sides S1a, S2a, and the pad pattern 346 of the second capacitor pad 344b may have two relatively long sides S1b, S2b.

In some example embodiments, the pad pattern 346 of the first capacitor pad 344a and the pad pattern 346 of the second capacitor pad 344b may have a side S2a and a side S1b positioned relatively close to each other. The pad pattern 344 of the first capacitor pad 344a and the pad pattern 344 of the second capacitor pad 344b may have a side Sla and a side S2b positioned relatively far away from each other.

The three via patterns 348 of the first capacitor pad 344a may be positioned to be eccentric toward the side Sla of the pad pattern 344 that is positioned relatively far away from the pad pattern 344 of the second capacitor pad 344b. That is, the three via patterns 348 of the first capacitor pad 344a may be arranged adjacent to the side S1a.

The three via patterns 348 of the second capacitor pad 344b may be positioned to be eccentric toward the side S2b of the pad pattern 344 that is positioned relatively far away from the pad pattern 344 of the first capacitor pad 344a. That is, the three via patterns 348 of the second capacitor pad 344b may be arranged adjacent to the side S2b.

Figure 21:
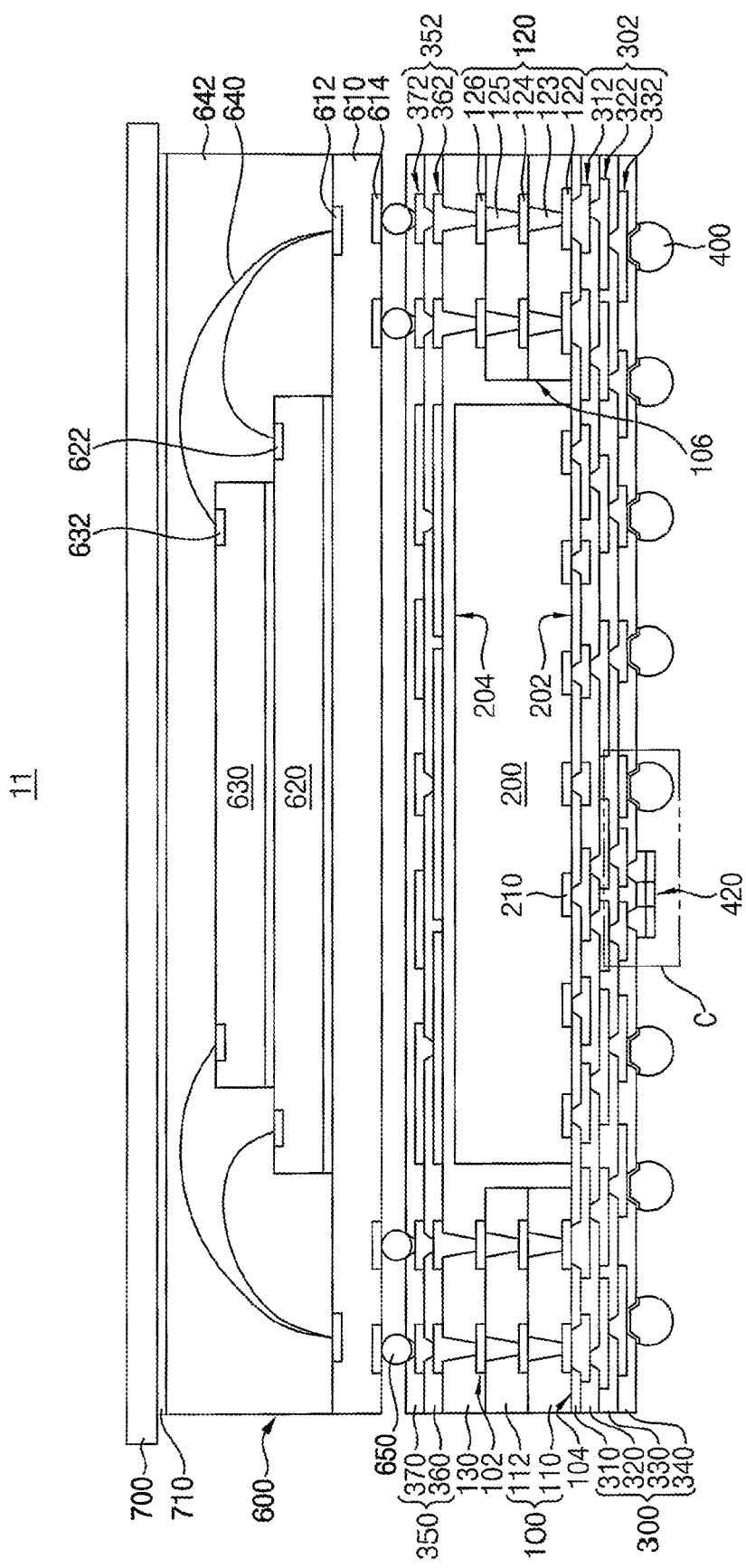
Figure 22:
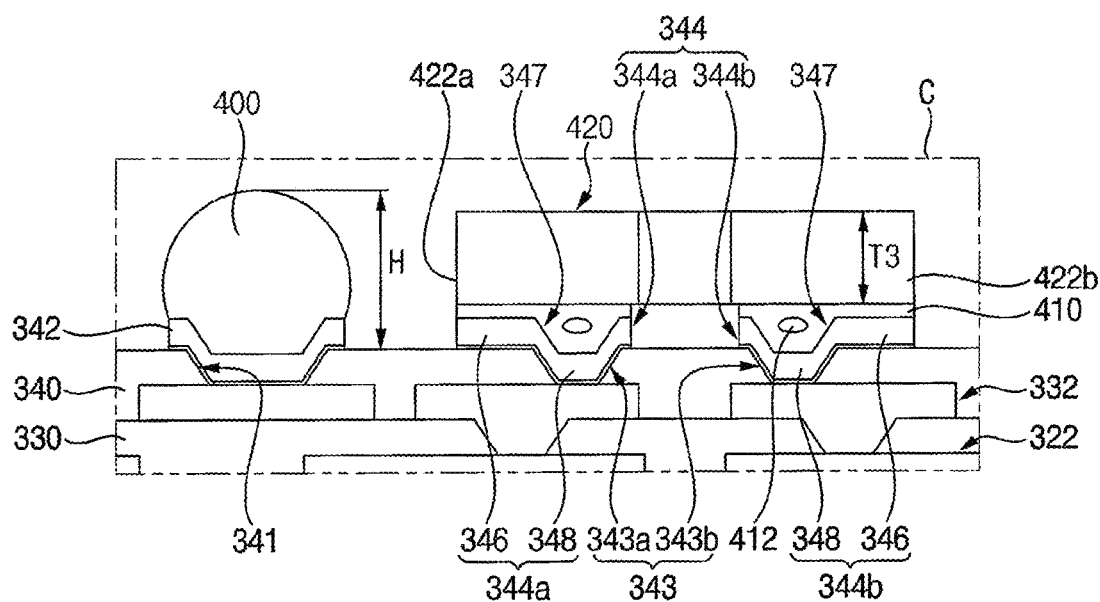

FIG. 21 is a cross-sectional view illustrating a semiconductor package in accordance with some example embodiments. FIG. 22 is an enlarged cross-sectional view illustrating portion 'C' in FIG. 21. The semiconductor package may be the same as or substantially similar to the semiconductor package described with reference to FIG. 1 except for an additional second package. Thus, same reference numerals will be used to refer to the same or like elements and any further repetitive explanation concerning the above elements will be omitted.

Referring to FIG. 21, a semiconductor package 11 may include a first package and a second package 600 stacked on the first package. The semiconductor package 11 may further include a heat sink 700 provided on the second package 600. The first package may include a core substrate 100, a semiconductor chip 200, a redistribution wiring layer 300, and an upper redistribution wiring layer 350. The first package may be the same as or substantially similar to the unit package described with reference to FIG. 1.

In some example embodiments, the second package 600 may be stacked on the first package via conductive connection members 650.

The second package 600 may include a second package substrate 610, second and third semiconductor chips 620, 630 mounted on the second package substrate 610, and a molding member 642 on the second package substrate 610 to cover the second and third semiconductor chips 620, 630.

The second package 600 may be stacked on the first package via the conductive connection members 650. For example, the conductive connection members 650 may include solder balls, conductive bumps, etc. The conductive connection member 650 may be arranged between a second upper redistribution wiring 386 of the upper redistribution wiring layer 350 and a second bonding pad 614 of the second package substrate 610. Accordingly, the first package and the second package 600 may be electrically connected to each other by the conductive connection members 650.

The second and third semiconductor chips 620, 630 may be stacked on the second package substrate 610 by adhesive members. Bonding wires 640 may electrically connect chip pads 622, 632 of the second and third semiconductor chips 620, 630 to first bonding pads 612 of the second package substrate 610. The second and third semiconductor chips 620, 630 may be electrically connected to the second package substrate 610 by bonding wires 640.

Although the second package 600 including two semiconductor chips mounted in a wire bonding manner are illustrated in the figure, it may be understood that the number, the mounting manner, etc. of the semiconductor chips of the second package may not be limited thereto.

In some example embodiments, the heat sink 700 may be provided on the second package 600 to dissipate heat from the first and second packages to the outside. The heat sink 700 may be attached on the second package 600 by a thermal interface material (TIM) 710.

Referring to FIG. 22, the first package may include at least one capacitor 420 mounted on an outer surface of the redistribution wiring layer 300. The capacitor 420 may be mounted on a pair of capacitor pads 344. First and second outer electrodes 422a, 422b of the capacitor 420 may be attached to first and second capacitor pads 344a, 344b via conductive pastes 410, respectively. A pair of the capacitor pads may be the same as or substantially similar to the capacitor pads described with reference to FIGS. 1 to 4. Thus, descriptions of the capacitor pads will be omitted.

Figure 23:
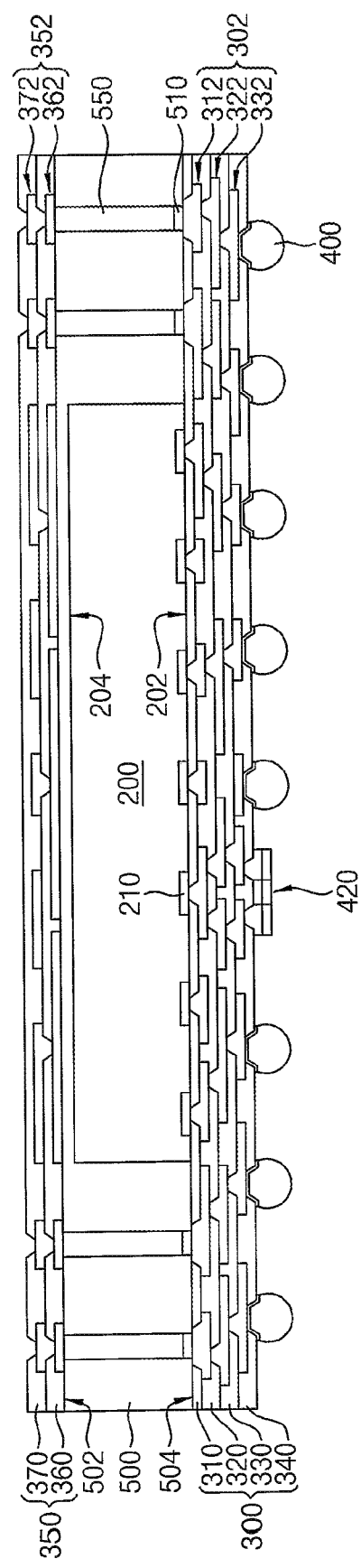

FIG. 23 is a cross-sectional view illustrating a semiconductor package in accordance with some example embodiments. The semiconductor package may be the same as or substantially similar to the semiconductor package described with reference to FIG. 1 except for a configuration of a mold substrate provided instead of a core substrate. Thus, same reference numerals will be used to refer to the same or like elements and any further repetitive explanation concerning the above elements will be omitted.

Referring to FIG. 23, a semiconductor package 12 may include a redistribution wiring layer 300, at least one semiconductor chip 200 arranged on the redistribution wiring layer 300, a mold substrate 500 on an upper surface of the redistribution wiring layer 300 to cover at least one surface of the semiconductor chip 200, and at least one capacitor 420 mounted on a lower surface of the redistribution wiring layer 300. Further, the semiconductor package 12 may further include a backside redistribution wiring layer 350 arranged on an upper surface 502 of the mold substrate 500 and outer connection members 400 arranged on the lower surface of the redistribution wiring layer 300.

In some example embodiments, the semiconductor chip 200 may include a plurality of chip pads 210 on an active surface (e.g., a first surface) of the semiconductor chip 200. The semiconductor chip 200 may be received in the mold substrate 500 such that the first surface on which the chip pads 210 are formed faces the redistribution wiring layer 300.

In some example embodiments, conductive connection columns 550 may be provided to penetrate at least a portion of the mold substrate 500 in a region outside the semiconductor chip 200. The conductive connection column 550 may be a mold through via (MTV) extending from the upper surface 502 to a lower substrate 504 of the mold substrate 500.

The redistribution wiring layer 300 may be disposed on the lower surface 504 of the mold substrate 500 and may have first redistribution wirings 302 electrically connected to the chip pads 210 of the semiconductor chip 200, respectively. The upper redistribution wiring layer 350 may be disposed on the upper surface 502 of the mold substrate 500 and may have second redistribution wirings 352 electrically connected to the conductive connection columns 550, respectively.

The capacitor 420 may be mounted on a pair of capacitor pads provided on the outer surface of the redistribution wiring layer 300. A pair of the capacitor pads may be the same as or substantially similar to the capacitor pads described with reference to FIGS. 1 to 4. Thus, descriptions of the capacitor pads will be omitted.

Hereinafter, a method of manufacturing the semiconductor package in FIG. 23 will be explained.

FIGS. 24 to 30 are cross-sectional views illustrating stages in a method of manufacturing a semiconductor package in accordance with some example embodiments.

Figure 24:
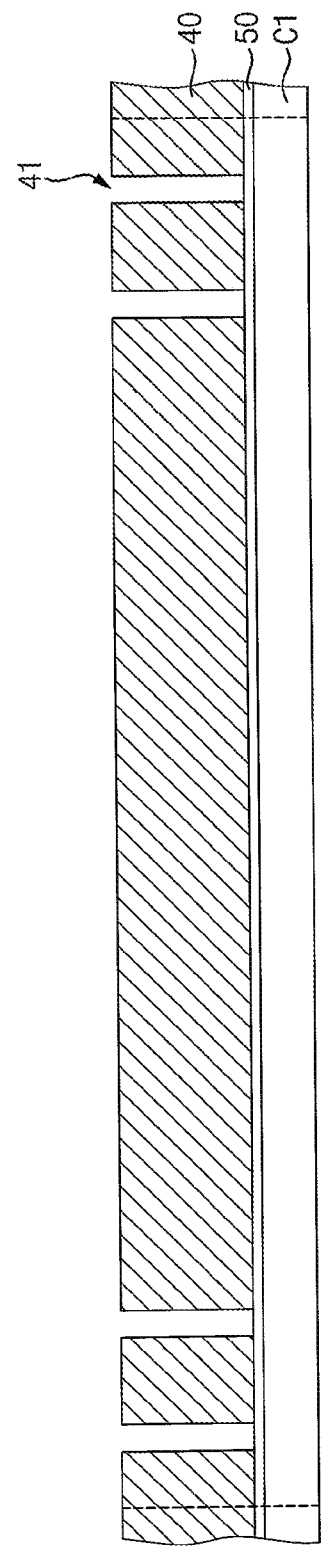

Referring to FIG. 24, a seed layer 50 and a photoresist pattern 40 having openings 41 for forming conductive connectors may be formed on a first carrier substrate C1.

In some example embodiments, the first carrier substrate C1 may include a wafer substrate. The wafer substrate W may be used as a base substrate on which a plurality of semiconductor chips is arranged and a molding member is to be formed to cover the semiconductor chips. The wafer substrate may have a shape corresponding to a wafer on which a semiconductor fabrication process is performed.

The wafer substrate may include a redistribution region on which a redistribution wiring layer is formed and a scribe lane region, that is, cutting region surrounding the redistribution region. As described later, the redistribution wiring layer and the molding member formed on the wafer substrate may be sawed along the cutting region dividing the redistribution regions to be individualized.

For example, the seed layer 50 may be formed by a sputtering process. The seed layer may include an alloy layer including titanium/copper (Ti/Cu), titanium/palladium (Ti/Pd), titanium/nickel (Ti/Ni), chromium/copper (Cr/Cu) or a combination thereof.

After a photoresist layer is formed on the seed layer 50, an exposure process may be performed on the photoresist layer to form the photoresist pattern 40 having the openings 41.

Figure 25:
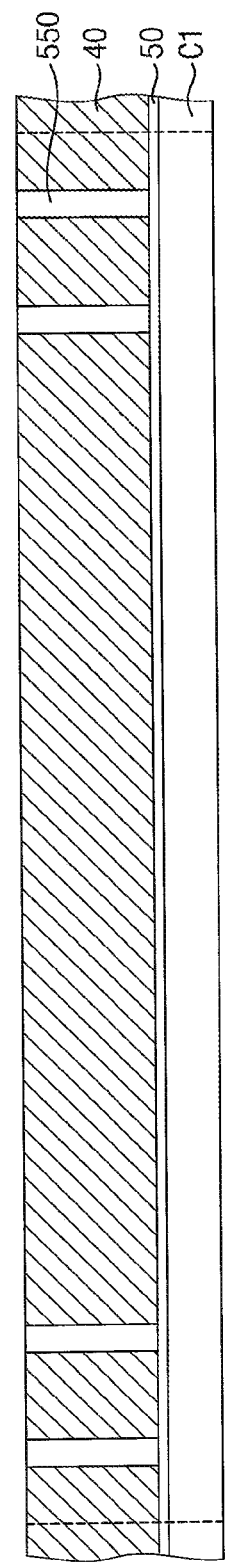
Figure 26:
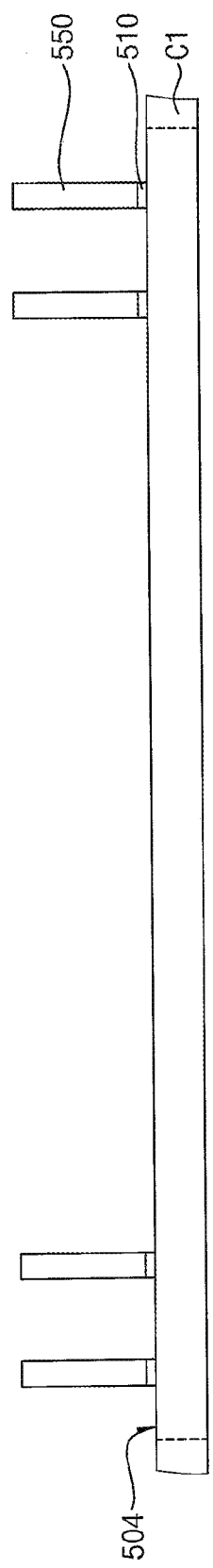

Referring to FIGS. 25 and 26, a plating process may be performed on the seed layer 50 to form conductive connection columns 550 as conductive connectors, the photoresist pattern 40 may be removed, and then, the seed layer 50 under the photoresist pattern 40 may be partially etched.

Figure 27:
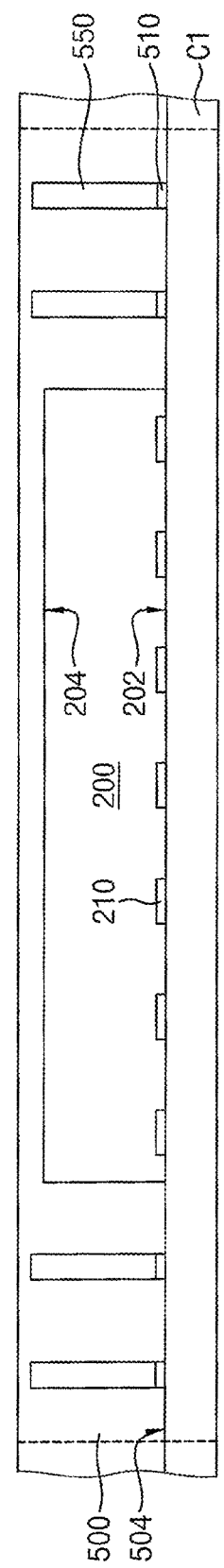

Referring to FIG. 27, a semiconductor chip 200 may be arranged on the first carrier substrate C1, and a mold substrate 500 may be formed to cover the semiconductor chip 200. The semiconductor chip 200 may be arranged on the first carrier substrate C1 such that a front surface on which the chip pads 210 are formed faces the first carrier substrate C1. For example, a height of the semiconductor chip 200 may be less than a height of the conductive connection column 550.

The mold substrate 500 may be formed on the first carrier substrate C1 to cover the semiconductor chip 200 and a plurality of the conductive connection columns 550. For example, the mold substrate 500 may include epoxy mold compound (EMC). The mold substrate 500 may be formed by a molding process, a screen printing process, a lamination process, etc.

Figure 28:
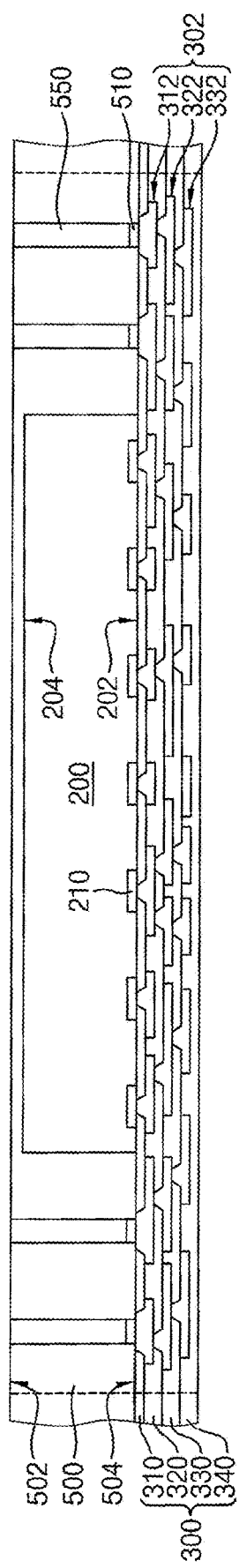

Referring to FIG. 28, processes the same as or similar to the processes descried with reference to FIG. 8 may be performed to form a redistribution wiring layer 300 on a lower surface 504 of the mold substrate 500 and the front surface 202 of the semiconductor chip 200. The redistribution wiring layer 300 may have first redistribution wirings 302 electrically connected to the chip pads 210 of the semiconductor chip 200 and the conductive connection columns 550.

Figure 29:
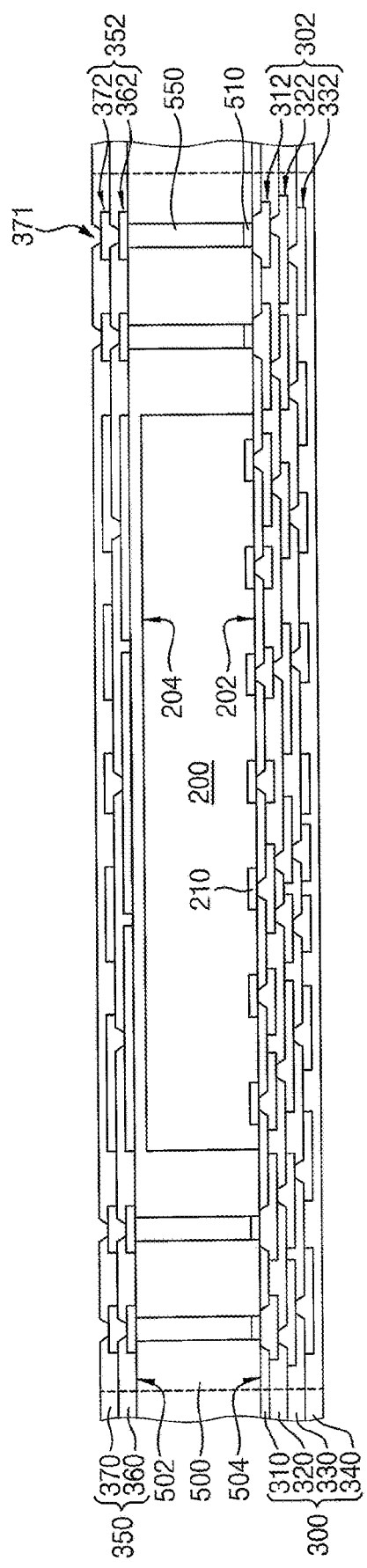

Referring to FIG. 29, processes the same as or similar to the processes descried with reference to FIG. 9 may be performed to form an upper redistribution wiring layer 350 on an upper surface 502 of the mold substrate 500.

Figure 30:
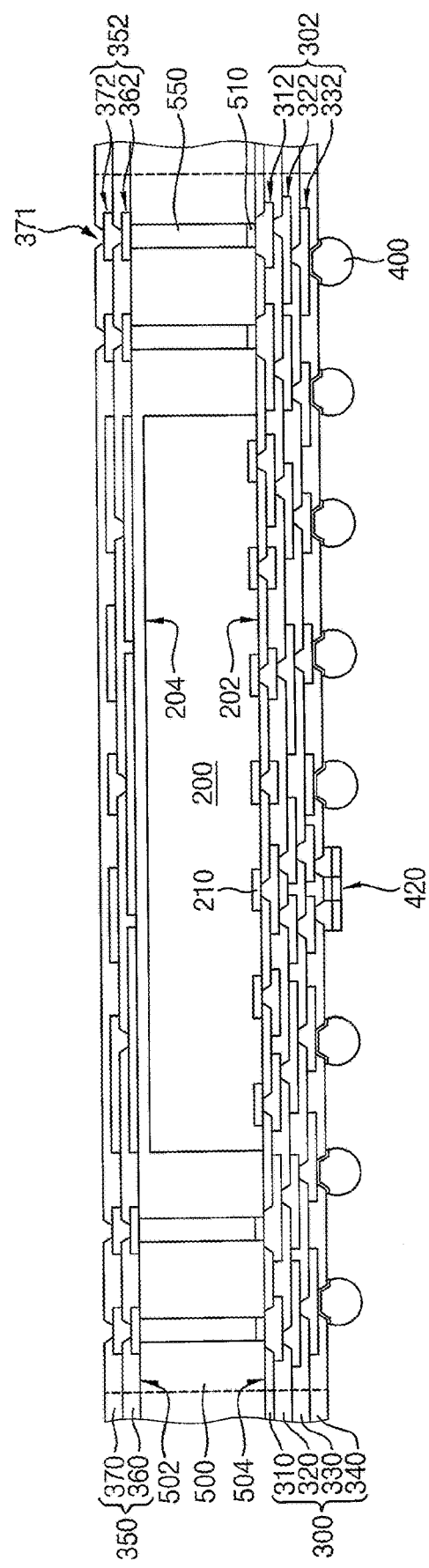

Referring to FIG. 30, processes the same as or similar to the processes descried with reference to FIGS. 10 to 18 may be performed to dispose outer connection members 400 and a capacitor 420 on an outer surface of the redistribution wiring layer 300.

Then, the redistribution wiring layer 300 and the mold substrate 500 may be cut by a sawing process to form an individual semiconductor package.

Figure 31:
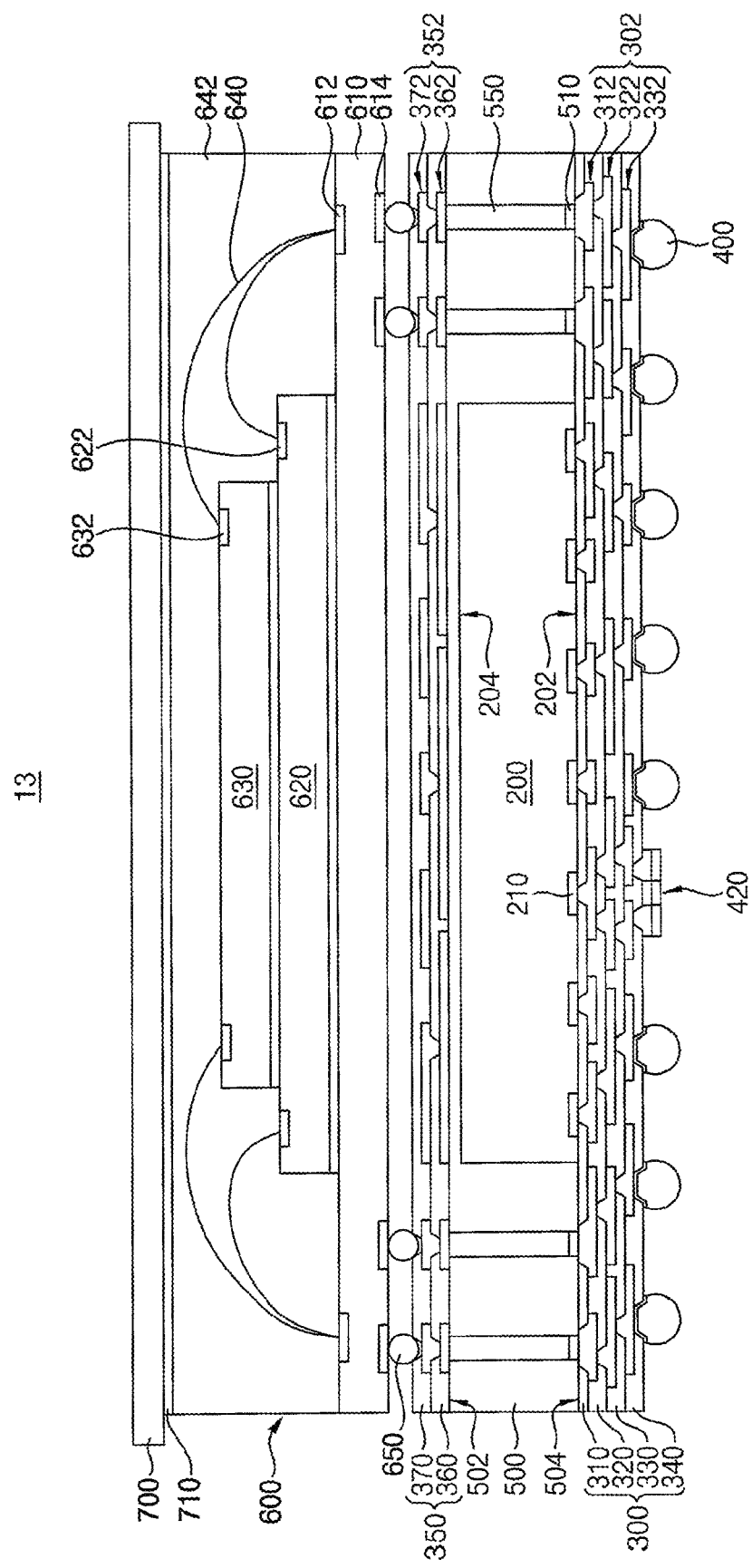

FIG. 31 is a cross-sectional view illustrating a semiconductor package in accordance with some example embodiments. The semiconductor package may be the same as or substantially similar to the semiconductor package described with reference to FIG. 21 except for a configuration of a mold substrate provided instead of a core substrate. Thus, same reference numerals will be used to refer to the same or like elements and any further repetitive explanation concerning the above elements will be omitted.

Referring to FIG. 31, a semiconductor package 13 may include a first package and a second package 600 stacked on the first package. The first package may be the same as or substantially similar to the unit package described with reference to FIG. 23.

In some example embodiments, conductive connection columns 550 may be provided to penetrate at least a portion of a mold substrate 500 in a region outside a semiconductor chip 200. The conductive connection column 550 may be a mold through via (MTV) extending from an upper surface 502 to a lower substrate 504 of a mold substrate 500.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of some example embodiments and is not to be construed as limiting thereof. Although a few example embodiments have been described, those skilled in the art will readily appreciate that many modifications are possible in the disclosed example embodiments without materially departing from the novel teachings and advantages of the present inventive concepts. Accordingly, all such modifications are intended to be included within the scope of example embodiments as defined in the claims.

What is claimed is:

1. A method of manufacturing a semiconductor package, comprising:

forming a plurality of conductive connection columns in a fan out region on a carrier substrate;

arranging a semiconductor chip on the carrier substrate such that a front surface of the semiconductor chip, on which chip pads are formed, faces the carrier surface;

forming a molding member on the carrier substrate to cover the semiconductor chip and the plurality of conductive connection columns;

removing the carrier substrate such that the front surface of the semiconductor chip is exposed from a lower surface of the molding member;

forming a redistribution wiring layer on the lower surface of the molding member and the front surface of the semiconductor chip, the redistribution wiring layer including redistribution wirings electrically connected to the chip pads and the conductive connection columns;

forming an upper redistribution wiring layer on an upper surface of the molding member;

forming a pair of capacitor pads, the pair of capacitor pads exposed from an outer surface of the redistribution wiring layer and electrically connected to corresponding ones of the redistribution wirings, respectively;

coating conductive pastes on the capacitor pads, respectively; and mounting a capacitor on the pair of capacitor pads via the conductive pastes, the capacitor having first and second outer electrodes, the first and second outer electrodes on the capacitor pads, respectively, wherein each of the capacitor pads includes,
a pad pattern exposed from the outer surface of the redistribution wiring layer, and
at least one via pattern at a lower portion of the pad pattern, the via pattern electrically connected to at least one of the redistribution wirings, and wherein the via pattern is eccentric by a distance from a center line of the pad pattern.

2. The method of claim 1, wherein a diameter of the via pattern is 40% or less of a width of the pad pattern.

3. The method of claim 1, wherein a width of the pad pattern is within a range of 150 μm to 500 μm, and a diameter of the via pattern is within a range of 50 μm to 200 μm.

4. The method of claim 1, wherein the pad pattern is a rectangular pad having a first side and a second side, and the center line passes a midpoint of the second side of the pad pattern.

5. The method of claim 4, wherein the via pattern includes at least three via patterns that are along an extending direction of the first side and are spaced apart from each other.

6. The method of claim 4, wherein the via pattern includes a plurality of via patterns and a spacing distance in an extending direction of the first side between the via patterns is within a range of 250 μm to 450 μm.

7. The method of claim 1, wherein the pad pattern has a dimple in an upper portion of the via pattern.

8. The method of claim 7, wherein at least one of the conductive pastes has a void above the dimple.

9. The method of claim 1, wherein the redistribution wiring layer further includes a solder ball pad exposed from the outer surface of the redistribution wiring layer.

10. The method of claim 9, wherein a diameter of the solder ball pad is greater than a width of the pad pattern.

11. A method of manufacturing a semiconductor package, the method comprising:

forming a redistribution wiring layer having a first surface and a second surface opposite to each other, the redistribution wiring layer including redistribution wirings stacked in at least two levels;

arranging at least one semiconductor chip on the first surface of the redistribution wiring layer, the at least one semiconductor chip having chip pads electrically connected to corresponding ones of the redistribution wirings, respectively;

forming a mold substrate on the redistribution wiring layer and covering the semiconductor chip;

forming a pair of capacitor pads exposed from the second surface of the redistribution wiring layer and electrically connected to a corresponding pair of the redistribution wirings, respectively, each of the capacitor pads including a pad pattern exposed from an outer surface of the redistribution wiring layer and at least one via pattern at a lower portion of the pad pattern, the at least one via pattern electrically connected to at least one of outermost ones of the redistribution wirings; and mounting a capacitor on the pair of the capacitor pads, the capacitor having first and second outer electrodes, the first and second outer electrodes on the capacitor pads, respectively.

12. The method of claim 11, wherein the via pattern is eccentric by a distance from a center line of the pad pattern.

13. The method of claim 12, wherein the pad pattern is a rectangular pad having a first side and a second side, and the center line passes a midpoint of the second side of the pad pattern.

14. The method of claim 13, wherein the via pattern includes at least three via patterns that are along an extending direction of the first side and are spaced apart from each other.

15. The method of claim 14, wherein the via pattern includes a plurality of via pattern and a spacing distance in the extending direction of the first side between the via patterns is within a range of 250 μm to 450 μm.

16. The method of claim 11, wherein the via pattern includes a first via pattern and a second via pattern and a spacing distance between the first via pattern of one of the capacitor pads and the second via pattern of another of the capacitor pads is within a range of 130 μm to 300 μm.

17. The method of claim 11, wherein the pad pattern has a dimple in an upper portion of the via pattern.

18. The method of claim 11, wherein the forming of the pair of capacitor pads includes:

patterning an outermost lower insulation layer of the redistribution wiring layer to form openings that expose portions of an outermost redistribution wirings of the redistribution wirings, the openings including a pair of via holes;

forming a seed layer on the outermost lower insulation layer;

forming a photoresist pattern having openings that expose portions of the seed layer on the outermost ones of the redistribution wirings, on the seed layer; and performing a plating process on the seed layer to form the pair of capacitor pads, wherein the via pattern is formed in each of the via holes.

19. The method of claim 18, wherein a diameter of each of the via holes is within a range of 50 μm to 200 μm.

20. A method of manufacturing a semiconductor package, the method comprising:

forming a plurality of conductive connection columns in a fan out region on a carrier substrate;

arranging a semiconductor chip on the carrier substrate such that a front surface of the semiconductor chip, on which chip pads are formed, faces the carrier substrate;

forming a molding member on the carrier substrate to cover the semiconductor chip and the plurality of conductive connection columns;

removing the carrier substrate such that the front surface of the semiconductor chip is exposed from a lower surface of the molding member;

forming a redistribution wiring layer on the lower surface of the molding member and the front surface of the semiconductor chip, the redistribution wiring layer including redistribution wirings electrically connected to the chip pads and the conductive connection columns;

forming an upper redistribution wiring layer on an upper surface of the molding member;

forming a pair of capacitor pads, the pair of capacitor pads exposed from an outer surface of the redistribution wiring layer and electrically connected to corresponding ones of the redistribution wirings, respectively; and mounting a capacitor on the pair of capacitor pads, the capacitor having first and second outer electrodes, the first and second outer electrodes on the capacitor pads, respectively, wherein each of the capacitor pads includes,
- a pad pattern exposed from the outer surface of the redistribution wiring layer, and
- at least one via pattern at a lower portion of the pad pattern, the at least one via pattern electrically connected to at least one of the redistribution wirings.

\* \* \* \* \*